US010892025B2

(12) United States Patent
Banerjee et al.

(10) Patent No.: US 10,892,025 B2
(45) Date of Patent: Jan. 12, 2021

(54) SOFT ERASE AND PROGRAMMING OF NONVOLATILE MEMORY

(71) Applicant: Western Digital Technologies, Inc., San Jose, CA (US)

(72) Inventors: Amiya Banerjee, Bangalore (IN); Shreesha Prabhu, Bangalore (IN); Saugata Das Purkayastha, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/440,631

(22) Filed: Jun. 13, 2019

(65) Prior Publication Data

US 2020/0395087 A1    Dec. 17, 2020

(51) Int. Cl.
| | | |
|---|---|---|
| *G11C 16/34* | (2006.01) | |
| *G06F 13/16* | (2006.01) | |
| *G11C 11/56* | (2006.01) | |
| *G11C 16/14* | (2006.01) | |

(52) U.S. Cl.
CPC ...... *G11C 16/3445* (2013.01); *G06F 13/1668* (2013.01); *G11C 11/5635* (2013.01); *G11C 16/14* (2013.01)

(58) Field of Classification Search
CPC . G11C 16/3445; G11C 16/14; G11C 11/5635; G06F 13/1668
USPC ............ 365/185.29, 185.22, 185.09, 185.17
See application file for complete search history.

(56) References Cited

U.S. PATENT DOCUMENTS

| | | | |
|---|---|---|---|
| 5,920,501 A | * | 7/1999 | Norman ............ G11C 16/3431 365/185.02 |
| 6,314,026 B1 | | 11/2001 | Satoh et al. |
| 9,123,440 B2 | | 9/2015 | Kim |
| 9,466,360 B2 | | 10/2016 | Yoo |
| 9,595,342 B2 | | 3/2017 | Pang et al. |
| 2015/0117114 A1 | * | 4/2015 | Wan ................... G11C 11/5642 365/185.21 |

(Continued)

FOREIGN PATENT DOCUMENTS

| | | |
|---|---|---|
| CN | 106486169 A | 3/2017 |
| KR | 20070109684 A | 11/2007 |

OTHER PUBLICATIONS

Machine-translation of CN Publication No. CN106486169 published Mar. 8, 2017.

(Continued)

*Primary Examiner* — Connie C Yoha
(74) *Attorney, Agent, or Firm* — Vierra Magen Marcus LLP

(57) ABSTRACT

A non-volatile storage apparatus includes a plurality of non-volatile memory cells and control circuitry. The control circuitry is configured to apply one or more soft erase pulses to the plurality of non-volatile memory cells to reduce threshold voltages of the plurality of non-volatile memory cells from initial levels corresponding to programmed data to intermediate levels below the initial levels and above an erased level. The control circuitry is configured to apply one or more soft programming pulse to increase threshold voltages of the plurality of non-volatile memory cells from the intermediate levels to final levels corresponding to the programmed data.

20 Claims, 22 Drawing Sheets

(56) References Cited

U.S. PATENT DOCUMENTS

2015/0364199 A1* 12/2015 Kang ............... H01L 27/10814
 714/764
2018/0218775 A1 8/2018 Kim et al.

OTHER PUBLICATIONS

Machine-translation of KR Publication No. KR20070109684 published Nov. 15, 2007.

* cited by examiner

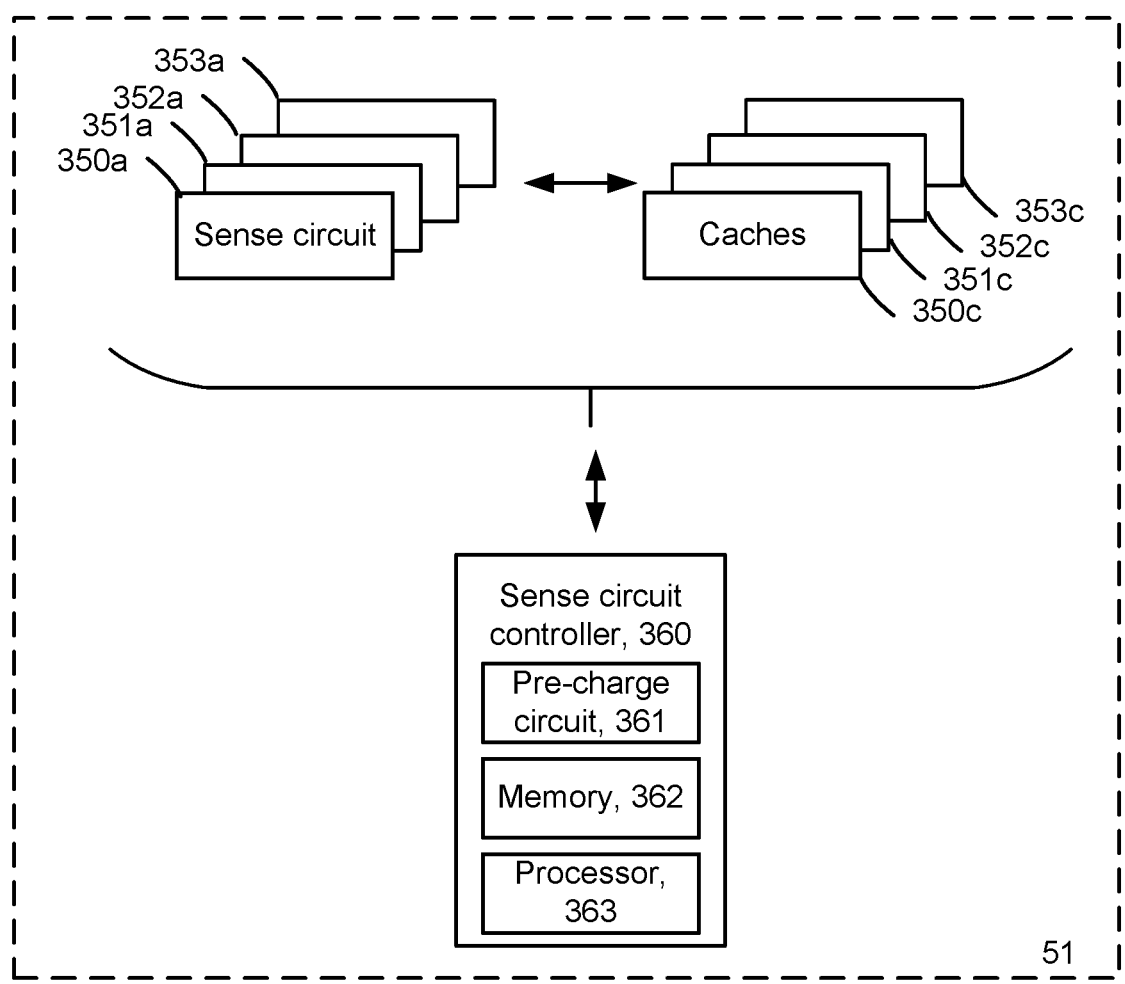

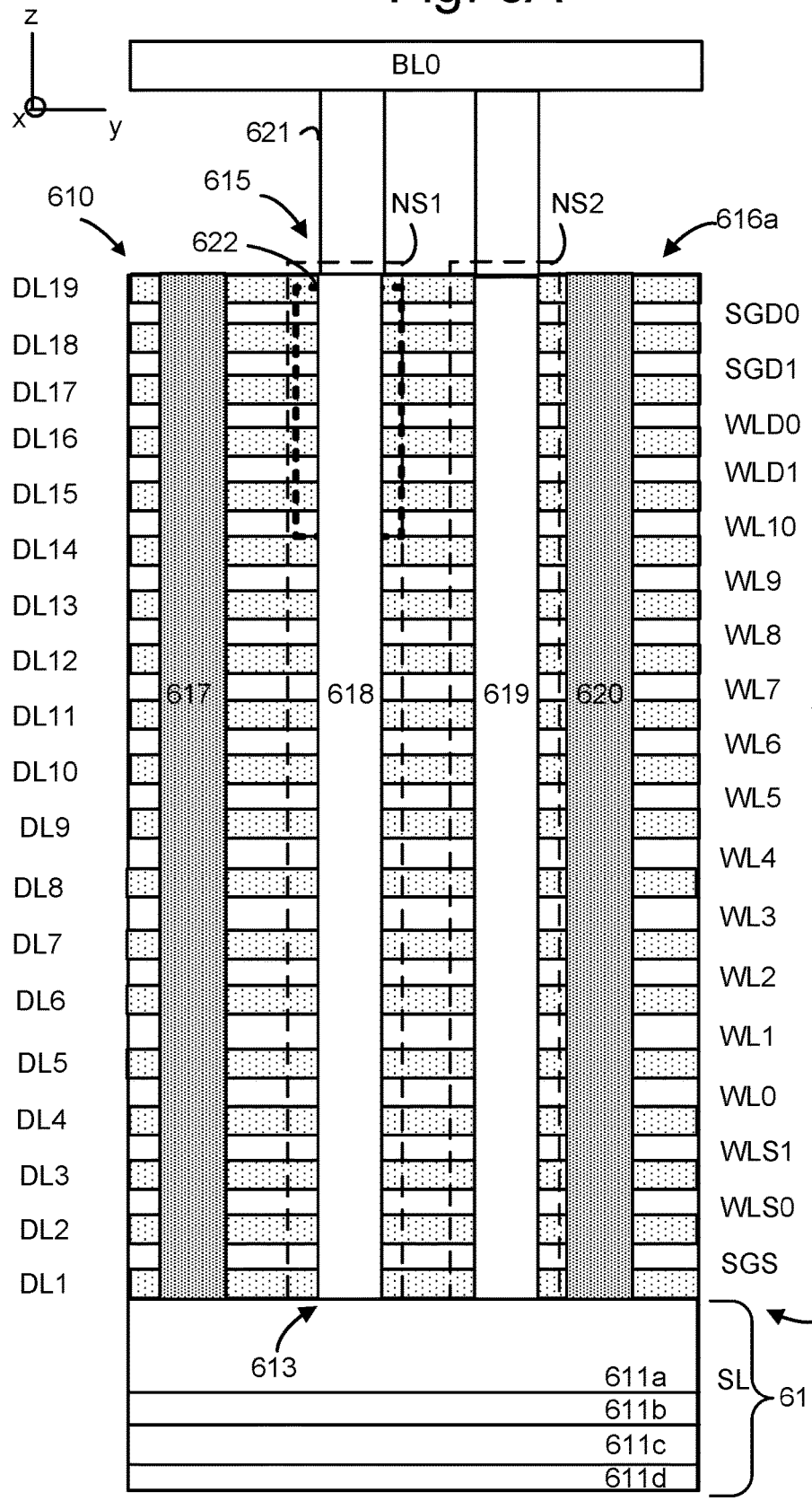
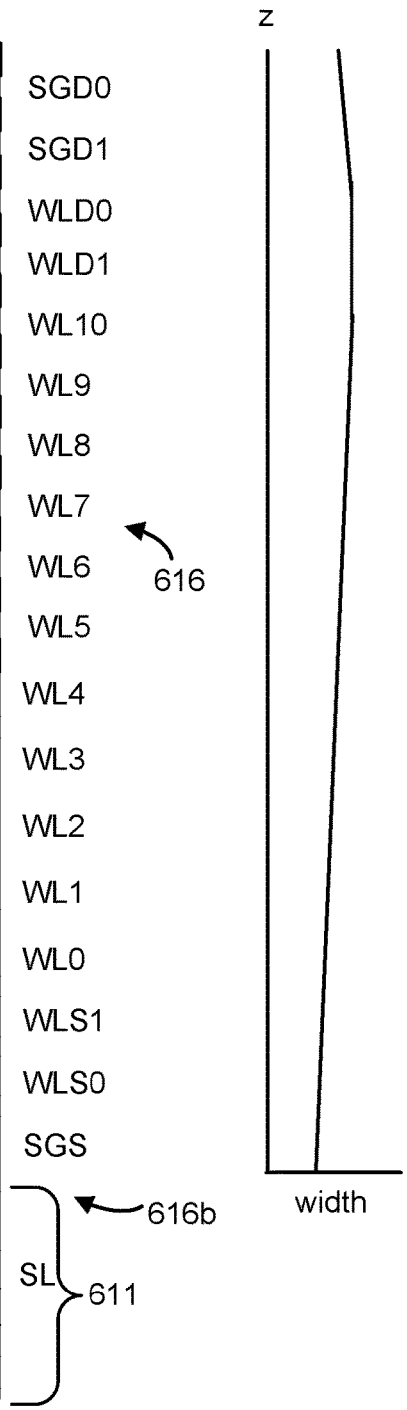
Fig. 6A
Fig. 6B

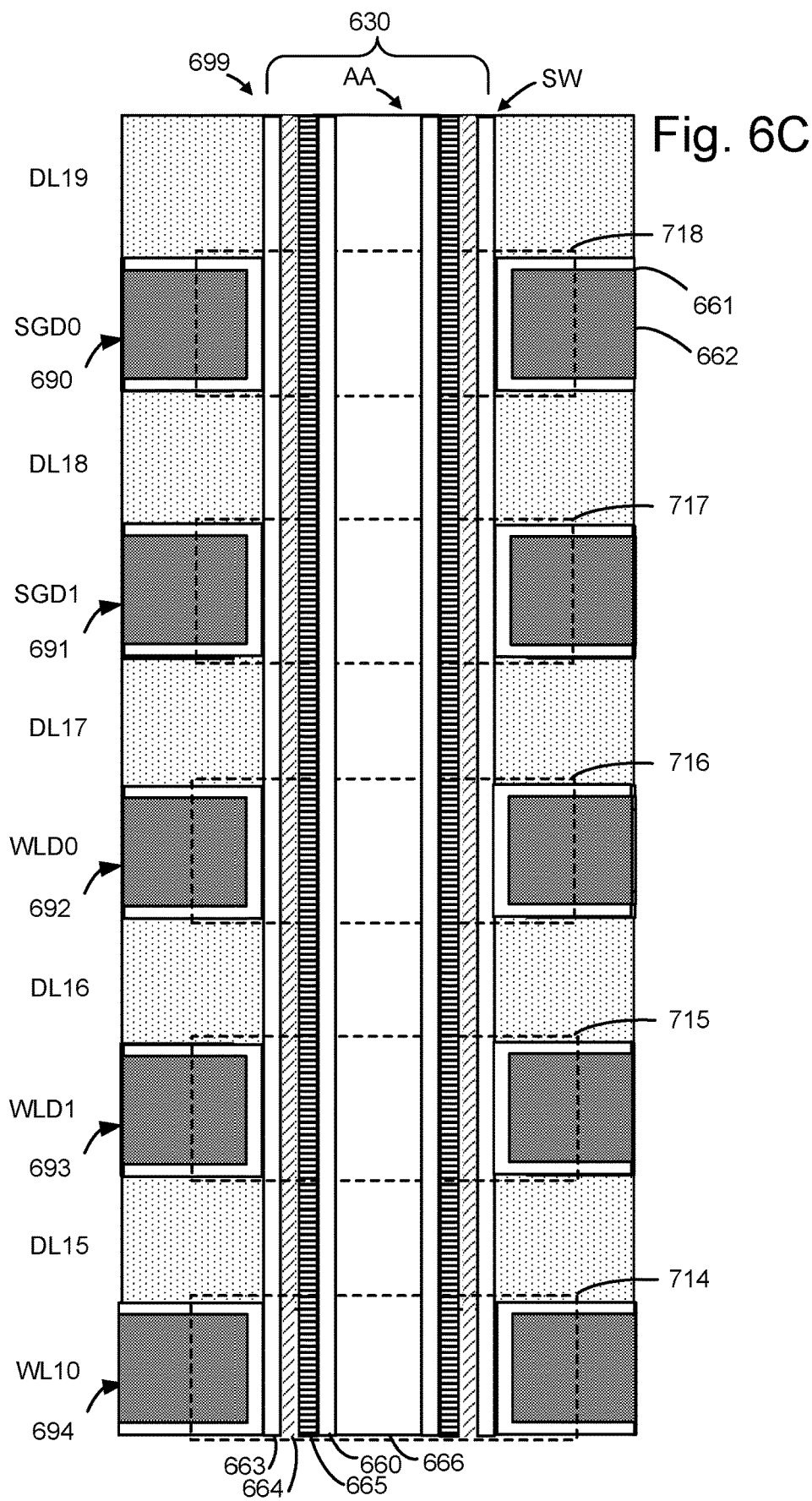

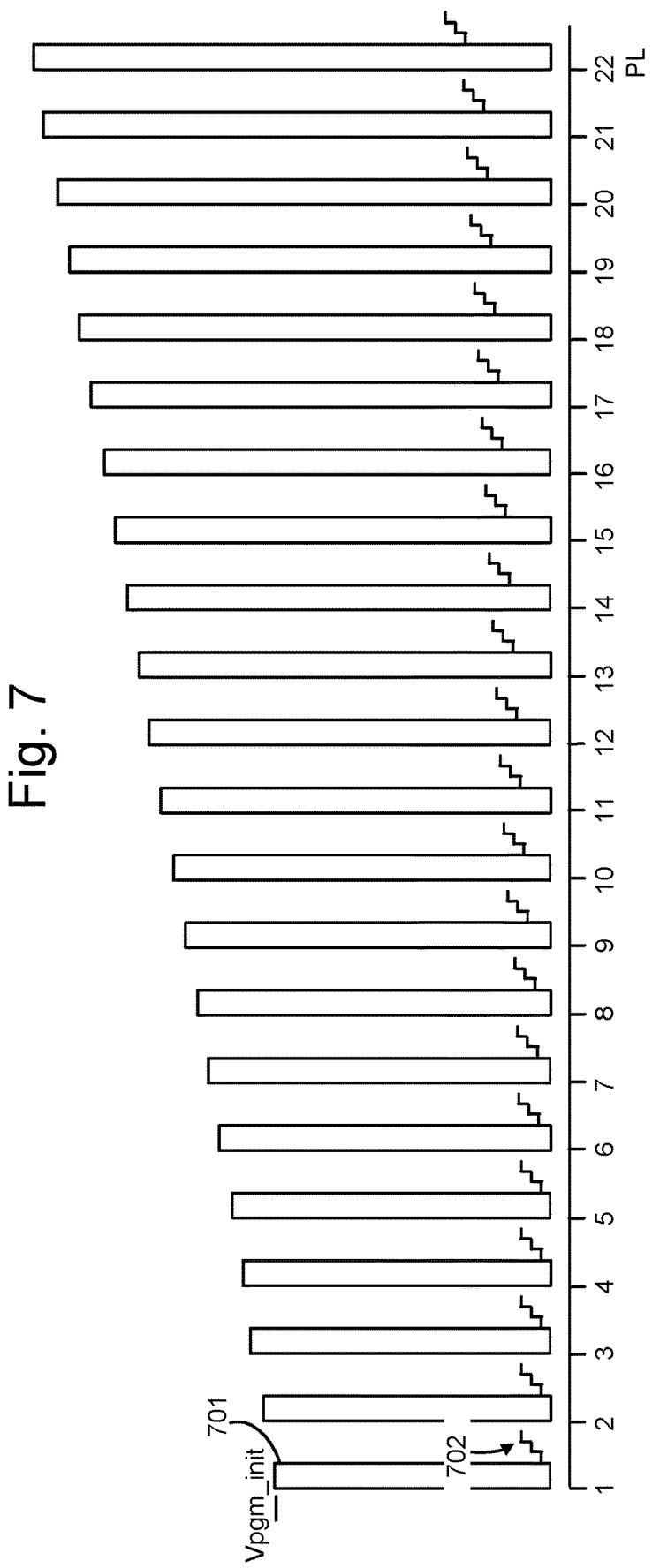

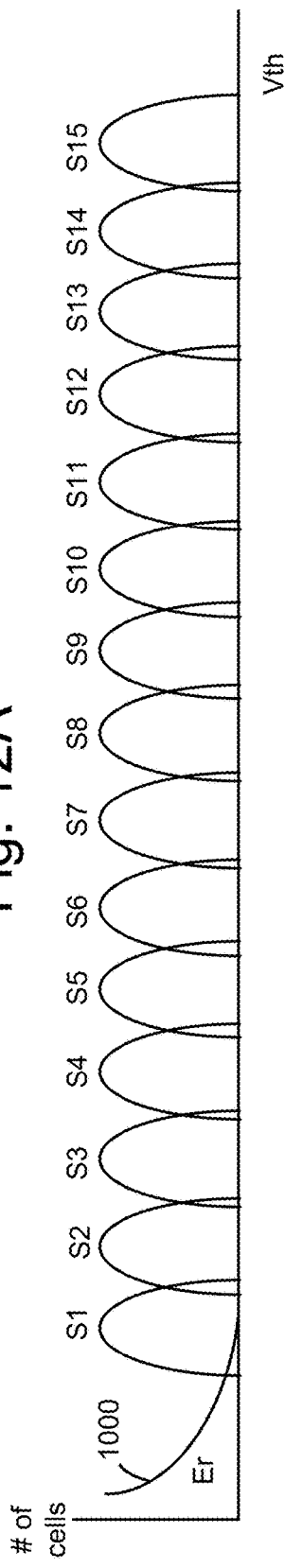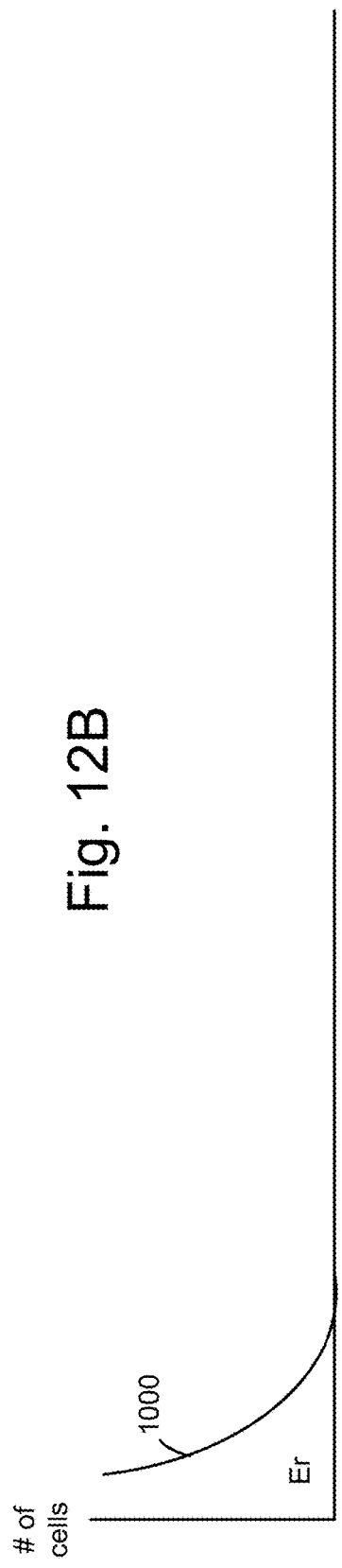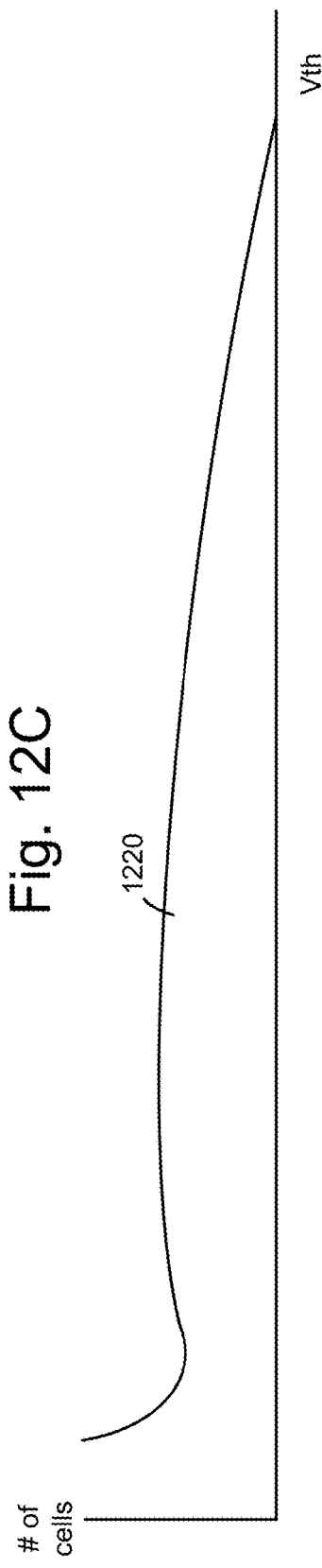

SOFT ERASE AND PROGRAMMING OF NONVOLATILE MEMORY

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of the NAND string to selectively connect a channel of the NAND string to a source line or bit line. However, various challenges are presented in operating such memory devices.

BRIEF DESCRIPTION OF THE DRAWINGS

FIG. 3B depicts another example block diagram of the sense block 51 of FIG. 1.

FIG. 6A depicts an example cross-sectional view of a portion of one of the blocks of FIG. 5.

FIG. 6B depicts an example variation in the width of the memory holes of FIG. 6A along their height.

FIG. 6C depicts a close-up view of the region 622 of the stack of FIG. 6A.

FIG. 7 depicts an example of programming pulses in a program operation.

FIGS. 11A-B shows an example of copying degraded data back to the same block that it came from.

FIGS. 12A-C depict examples of threshold voltages of non-volatile memory cells at programmed levels, at erased levels, and at intermediate levels respectively.

DETAILED DESCRIPTION

Apparatuses and techniques are described for applying soft erase and soft programming, for example, to improve latency and endurance of non-volatile memory.

In some memory devices, data stored in non-volatile memory cells may become degraded over time and cause Bit Error Rate (BER) to increase. Such data may eventually become uncorrectable by ECC and/or may become sufficiently degraded to require significant time and/or resources to correct. Before such data degrades too much, it may be rewritten. However, rewriting the data to another block (e.g. to an erased block from an erased block pool) involves an erase operation and a programming operation which may take significant time. Cumulatively, such erase and programming operations may cause significant wear on non-volatile memory cells (which may be particularly significant in memories that have low endurance such as memories that use charge trapping).

A soft erase operation reduces threshold voltages of memory cells to intermediate levels between their initial levels (programmed levels corresponding to data states) and erased levels. A soft programming operation returns threshold voltages from the intermediate levels back to their programmed levels (generally, to their initial levels, with some corrections and some narrowing of distributions associated with data states). Thus, threshold voltages are cycled through smaller ranges causing less wear than if erase and program operations were performed. Wear on non-volatile memory cells is reduced accordingly using soft erase and soft programming compared with using erase and programming. The time required may be significantly less also.

A block may be selected for partial erase and partial programming based on one or more factors such as time since programming, number of reads, and BER. Data may be copied from the block to a temporary location and may be corrected prior to storage at the temporary location (e.g. using ECC). The temporary location may be any suitable location, e.g. in the same non-volatile memory, a different non-volatile memory, or in volatile memory. One or more soft erase pulses are applied to the block. Soft erase pulses may be fewer in number (lower loop count), lower in voltage, and/or shorter in duration than erase pulses and no erase verify may be performed after soft erase pulses. Soft programming pulses may be fewer in number, lower in voltage, and/or shorter in duration than programming pulses.

The result is a time-efficient and gentle operation that can facilitate maintaining data in a non-volatile memory over an extended time.

Figure 1:
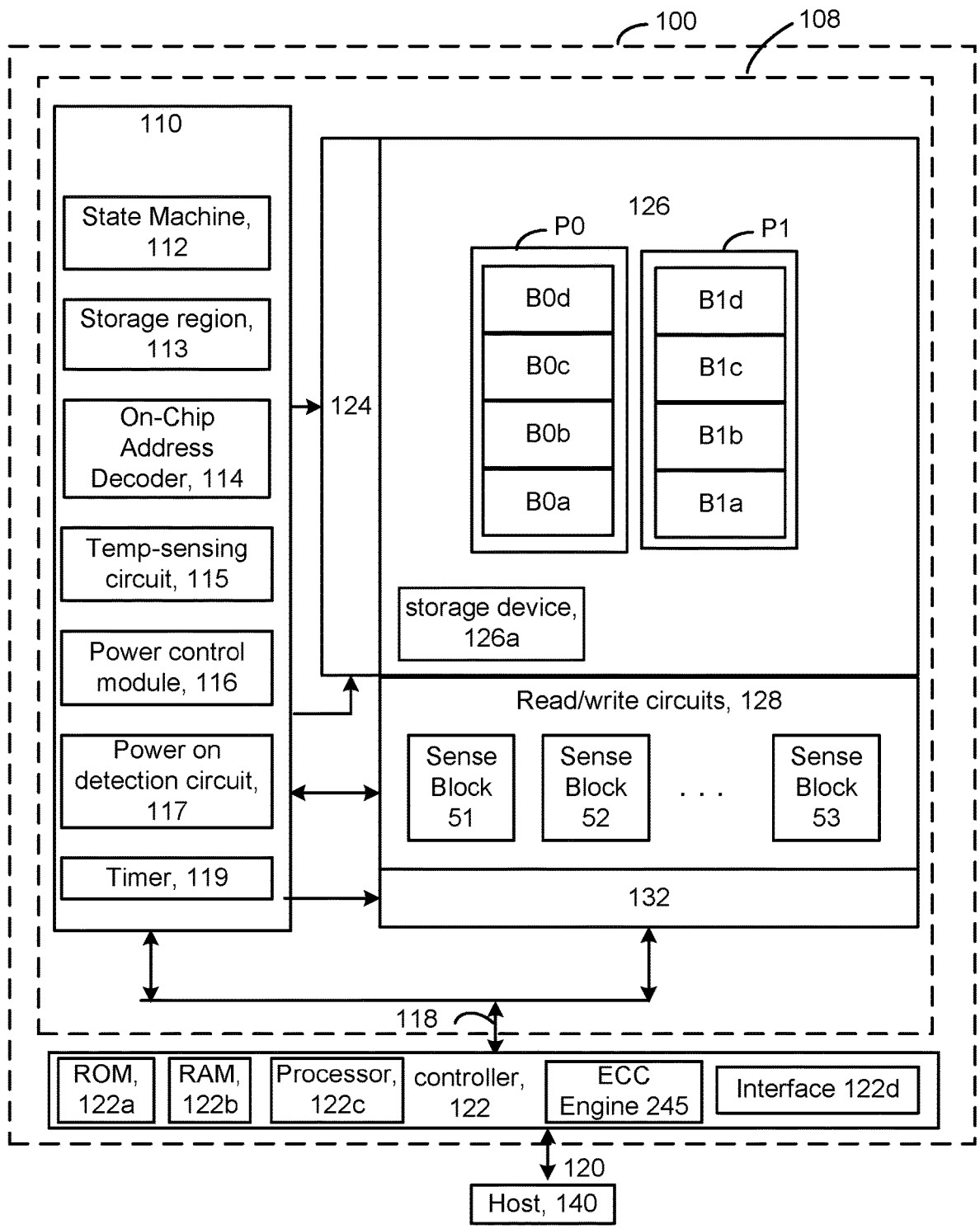
FIG. 1 is a block diagram of an example memory device comprising non-volatile memory cells in blocks.

FIG. 1 is a block diagram of an example memory device comprising memory cells arranged in different planes. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The memory structure 126 may comprise multiple planes, such as neighbor planes P0 and P1. Each plane may include one or more blocks of memory cells. For example, P0 includes blocks B0a-B0d and P1 includes blocks B1a-B1d.

The read/write circuits 128 include multiple sense blocks 51, 52, . . . 53 (sensing circuitry) and allow a page of memory cells to be read or programmed in parallel. Typically, a controller 122 is included in the same memory device 100 (e.g., a removable storage card or other non-volatile storage apparatus) as the one or more memory die 108. The controller may be separate from the memory die. Commands and data are transferred between the host 140 and controller 122 via an interface such as data bus 120, and between the controller and the one or more memory die 108 via lines 118.

The memory structure 126 can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126 including read, write and erase, and includes a state machine 112, an on-chip address decoder 114, a temperature-sensing circuit 115, a power control module 116, a power on detection circuit 117 and a timer 119.

The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits). The on-chip address decoder 114 provides an address interface between that used by the host or a memory controller to the hardware address used by the decoders 124 and 132. An indication of temperature which is obtained by the temperature-sensing circuit 115 may be used to adjust a read operation, as described further below.

The power control module 116 controls the power and voltages supplied to the word lines, select gate lines, bit lines and source lines during memory operations. It can include drivers for data and dummy word lines, SGS and SGD transistors and source lines. The sense blocks 51-53 can include bit line drivers, in one approach. The power on detection circuit may be used to detect when the memory device has been powered on. The detection circuit 117 may comprise an event handler which may be a software or firmware routine, or a routine implemented in hardware. The timer 119 may be used to determine a time which has elapsed since a last operation (e.g. read or write operation). The timer 119 may increment based on a clock signal used in the memory device.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, on-chip decoder 114, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error correction code (ECC) engine 245. The ECC engine can correct a number of read errors.

A memory interface 122d may also be provided. The memory interface 122d, in communication with ROM 122a, RAM 122b and processor 122c, is an electrical circuit that provides an electrical interface between controller 122 and memory die 108. For example, the memory interface can change the format or timing of signals, provide a buffer, isolate from surges, latch I/O and so forth. The processor 122c can issue commands to the control circuitry 110 (or any other component of the memory die) via the memory interface 122d.

The storage device comprises code such as a set of instructions, and the processor is operable to execute the set of instructions to provide the functionality described herein. Alternatively, or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read, write, and erase operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

While memory device 100 of FIG. 1 is one example of a non-volatile storage apparatus, other examples of non-volatile storage apparatuses may be implemented using the present technology.

Figure 1A:
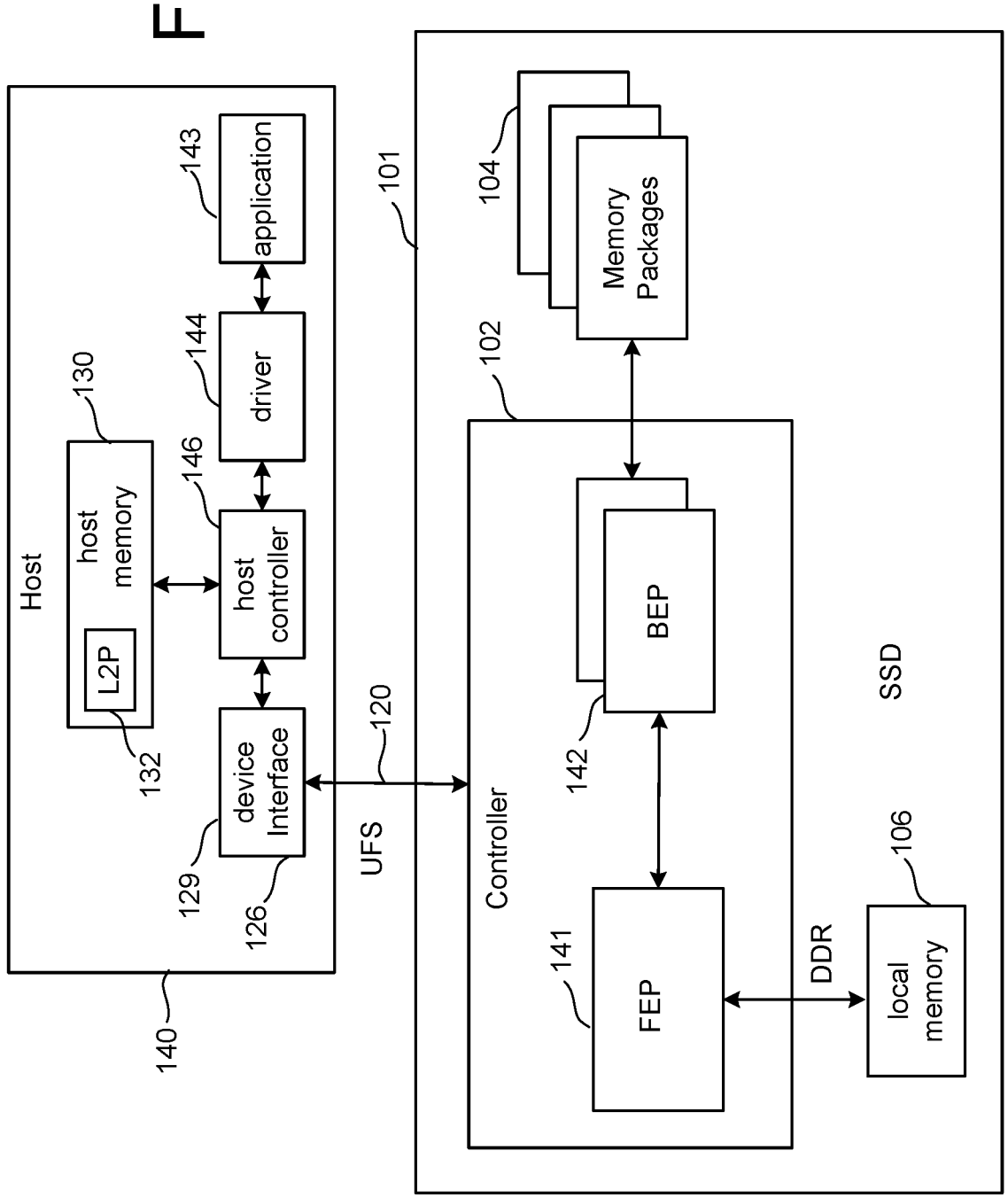
FIG. 1A is a block diagram of one embodiment of a memory device connected to a host.

FIG. 1A is a block diagram of one embodiment of a memory device 101 connected to host 140 that can implement the technology proposed herein. Memory device 101 may be considered another example of a non-volatile storage apparatus. Many different types of memory devices can be used with the technology proposed herein. One example memory device is a solid state drive ("SSD"); however, other types of memory devices can also be used. Memory device 101 comprises a controller 102, non-volatile memory 104 for storing data, and local memory 106 (e.g. DRAM. SRAM or ReRAM). In one embodiment, controller 102 comprises a Front End Processor (FEP) circuit 141 and one or more Back End Processor (BEP) circuits 142. In one embodiment FEP circuit 141 is implemented on an ASIC. In one embodiment, each BEP circuit 142 is implemented on a separate ASIC. In one embodiment, the ASICs for each of the BEP circuits 142 and the FEP circuit 141 are implemented on the same semiconductor such that the controller 102 is manufactured as a System on a Chip ("SoC"). FEP circuit 141 and BEP circuit 142 both include their own processors. In one embodiment, FEP circuit 141 and BEP circuit 142 work as a master slave configuration where the FEP circuit 141 is the master and each BEP circuit 142 is a slave. For example, FEP circuit 141 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). BEP circuit 142 manages memory operations in the memory packages/die at the request of FEP circuit 141. For example, the BEP circuit 142 can carry out the read, erase and programming processes. Additionally, the BEP circuit 142 can perform buffer management, set specific voltage levels required by the FEP circuit 141, perform error correction (e.g., generate error correction code (ECC)), control the Toggle Mode interfaces to the memory packages, etc. In one embodiment, each BEP circuit 142 is responsible for its own set of memory packages. Controller 102 is one example of a control circuit.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Controller 102 communicates with host 140 via an interface 120 (e.g. a data bus). In one embodiment, interface 120 implements a Universal Flash Storage ("UFS") interface. In other embodiments, other types of interfaces can be implemented including (but not limited to) NVM Express (NVMe) over PCI Express (PCIe). Table 1 describes the signals (other than power signals) in one embodiment of interface 120 when a UFS interface is implemented.

TABLE 1

| Signal Name | Type | Description |
| --- | --- | --- |
| REF_CLK | Input | Reference Clock. |
| DIN_t | Input | Downstream lane input. |
| DIN_c | Input | Differential input true and compliment signal pair. |
| DOUT_t | Output | Upstream lane output. |
| DOUT_c | Output | Differential output true and compliment signal pair. |
| RST_n | Input | Reset. |

Host 140 is configured to run a software application 143 that needs to access (e.g., write to and read from) memory device 101. To access memory device 101, application 143 communicates with driver 144, which is software for enabling communication between application 143 and memory device 101. The software implementing driver 144 can be executed by a microprocessor in host 140. Driver 144 is in communication with a host controller 146 (e.g., a microprocessor and software, or other type of processor) that communicates with memory device 101 via device interface 129. In one embodiment, device interface 129 includes a series of connectors, ports capacitors, etc. for physically connecting to memory device 101. Host controller 146 is also connected to host memory 130, which is the host's physical memory and can be DRAM, SRAM, non-volatile memory or another type of storage. Host 140 is external to and separate from memory device 101. In one embodiment, memory device 101 is embedded in host 140. In some embodiments, memory device 101 is not embedded in host 140, but is connected to host 140.

Host 140 is one example of an entity that is external to memory device 101. Other examples of an entity that is external to memory device 101 include other computing devices (e.g., computers, servers, smart appliances, smart phones, etc.) that are connected to memory device 101 and other computing systems that are in communication with memory device 101 via any communication means (e.g., LAN, WAN, WiFi, wired connection, wireless connection, direct connection, indirect connection, etc.)

Figure 1B:
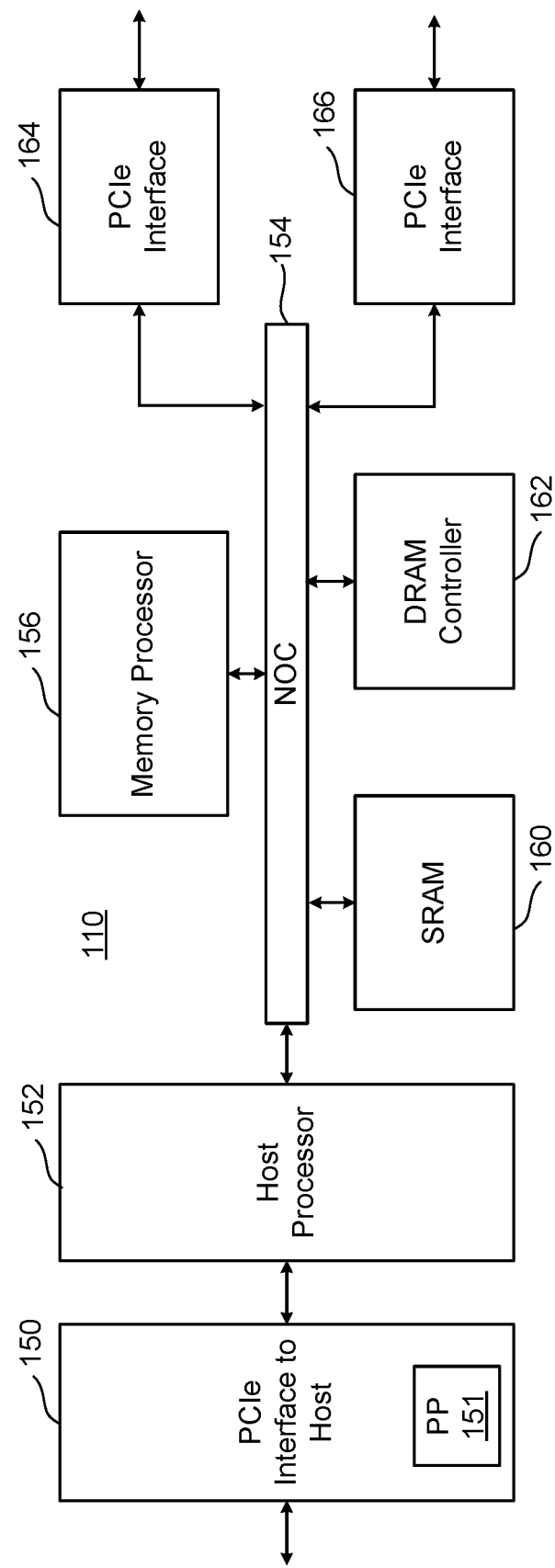
FIG. 1B is a block diagram of one embodiment of a Front End Processor Circuit. In some embodiments, the Front End Processor Circuit is part of a controller.

FIG. 1B is a block diagram of one embodiment of FEP circuit 141. FIG. 1B shows a PCIe interface 150 to communicate with host 140 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is memory processor 156, SRAM 160 and DRAM controller 162. The DRAM controller 162 is used to operate and communicate with the DRAM (e.g., local memory 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 1B, the SSD controller will include two BEP circuits 142; therefore, there are two PCIe Interfaces 164/166. Each PCIe Interface communicates with one of the BEP circuits 142. In other embodiments, there can be more or less than two BEP circuits 142; therefore, there can be more than two PCIe Interfaces.

Figure 1C:
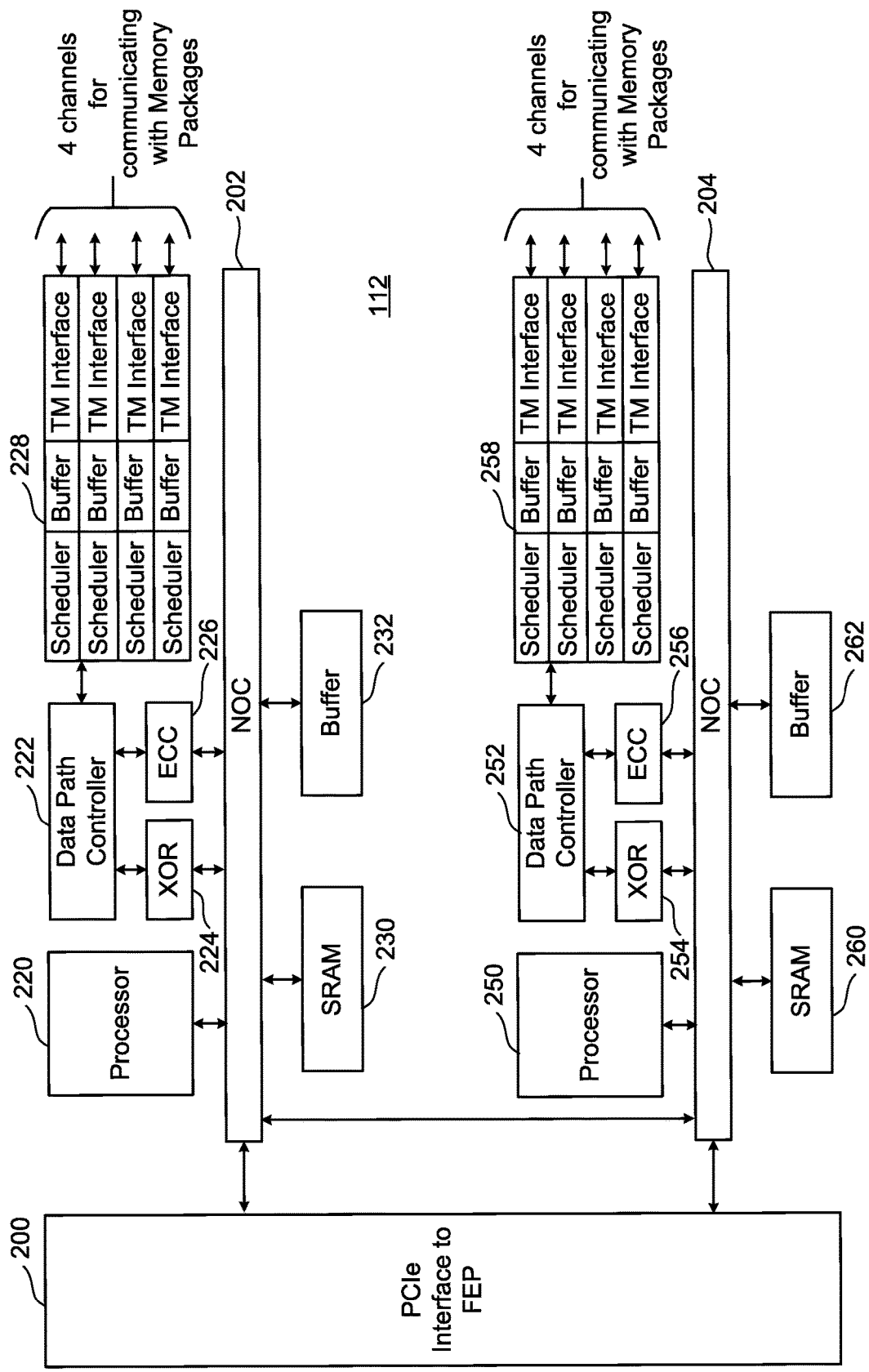
FIG. 1C is a block diagram of one embodiment of a Back End Processor Circuit. In some embodiments, the Back End Processor Circuit is part of a controller.

FIG. 1C is a block diagram of one embodiment of the BEP circuit 142. FIG. 1C shows a PCIe Interface 200 for communicating with the FEP circuit 141 (e.g., communicating with one of PCIe Interfaces 164 and 166 of FIG. 2). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art (e.g., encoding data to be written and decoding data that is read). The XOR engines 224/254 are used to XOR the data so that data can be combined (e.g. combine data) and stored in a manner that can be recovered in case there is a programming error. Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 1D:
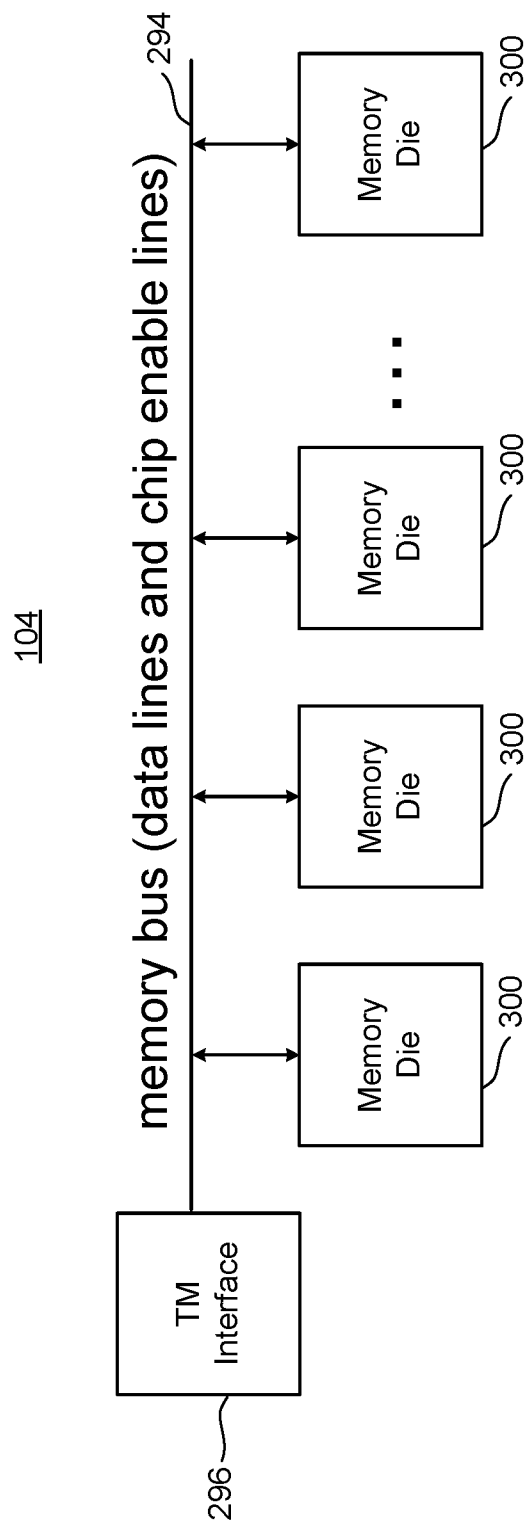
FIG. 1D is a block diagram of one embodiment of a memory package.

FIG. 1D is a block diagram of one embodiment of a memory package 104 that includes a plurality of memory die 300 connected to a memory bus (command lines, data lines and chip enable lines) 294. The memory bus 294 connects to a Toggle Mode Interface 296 for communicating with the TM Interface of a BEP circuit 142 (see e.g. FIG. 1C). In some embodiments, the memory package can include a small controller connected to the memory bus and the TM Interface. The memory package can have one or more memory die. In one embodiment, each memory package includes eight or sixteen memory die; however, other numbers of memory die can also be implemented. The technology described herein is not limited to any particular number of memory die.

FIGS. 1A-D provide one example architecture of a controller. However, the technology described herein is not limited to any specific form of the controller. Therefore, other architectures can be utilized for the controller. For example, other embodiments of a controller include microprocessors, microcontrollers, state machine, etc. in other configurations. In some cases, the controller can be inside the host. In other cases, the controller can be implemented on the memory die. Other options/configurations can also be used. A controller can also be referred to as a processor, even if it includes multiple processing cores, as the controller operates as a processor for the memory device.

Figure 2:
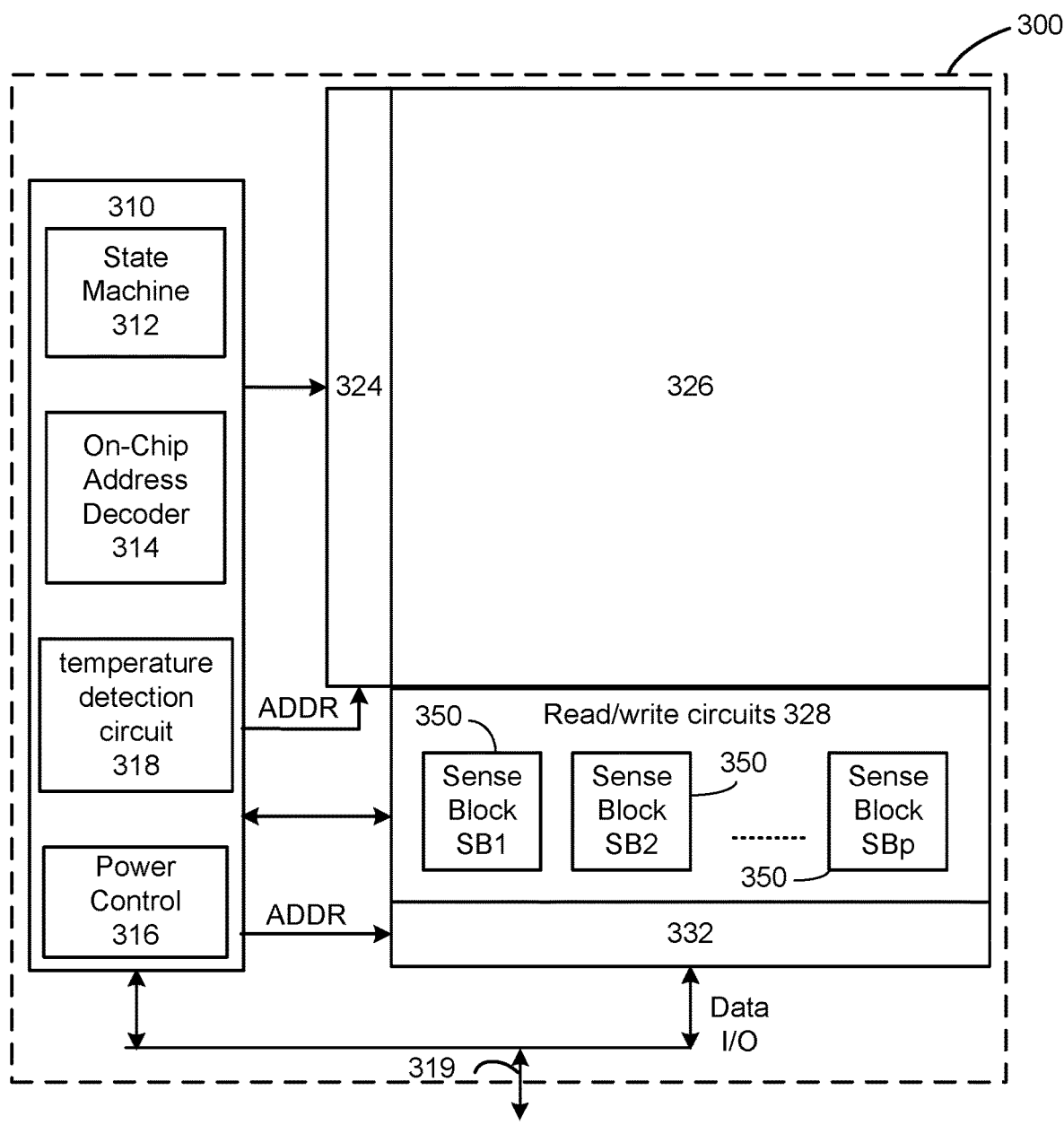
FIG. 2 is a block diagram of one embodiment of a memory die.

FIG. 2 is a functional block diagram of one embodiment of a memory die 300. Each of the one or more memory die 300 of FIG. 1D can be implemented as memory die 300 of FIG. 2. The components depicted in FIG. 2 are electrical circuits. In one embodiment, each memory die 300 includes a memory structure 326, control circuitry 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block includes a sense amplifier and a set of latches connected to the bit line. The latches store data to be written and/or data that has been read. The sense blocks include bit line drivers.

Commands and data are transferred between the controller 102 and the memory die 300 via lines 319. In one embodiment, memory die 300 includes a set of input and/or output (I/O) pins that connect to lines 118.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature detection circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced or augmented by a microcontroller or microprocessor. In one embodiment, control circuitry 310 includes buffers such as registers, ROM fuses and other storage devices for storing default values such as base voltages and other parameters.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, alone or in combination with read/write circuits 328 and decoders 324/332, comprise a control circuit connected to memory structure 326. This control circuit is an electrical circuit that performs the functions described below in the flow charts. In other embodiments, the control circuit can consist only of controller 102, which is an electrical circuit in combination with software (e.g., firmware), that performs the functions described below in the flow charts. In another alternative, the control circuit comprises controller 102 and control circuitry 310 performing the functions described below in the flow charts. In another embodiment, the control circuit comprises state machine 312 (and/or a microcontroller and/or microprocessor) alone or in combination with controller 102. In another alternative, the control circuit comprises controller 102, control circuitry 310, read/write circuits 328 and decoders 324/332 performing the functions described below in the flow charts. In other embodiments, the control circuit comprises one or more electrical circuits that operate non-volatile memory.

In one embodiment, memory structure 326 comprises a monolithic three dimensional memory array of non-volatile memory cells in which multiple memory levels are formed above a single substrate. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

Figure 3A:
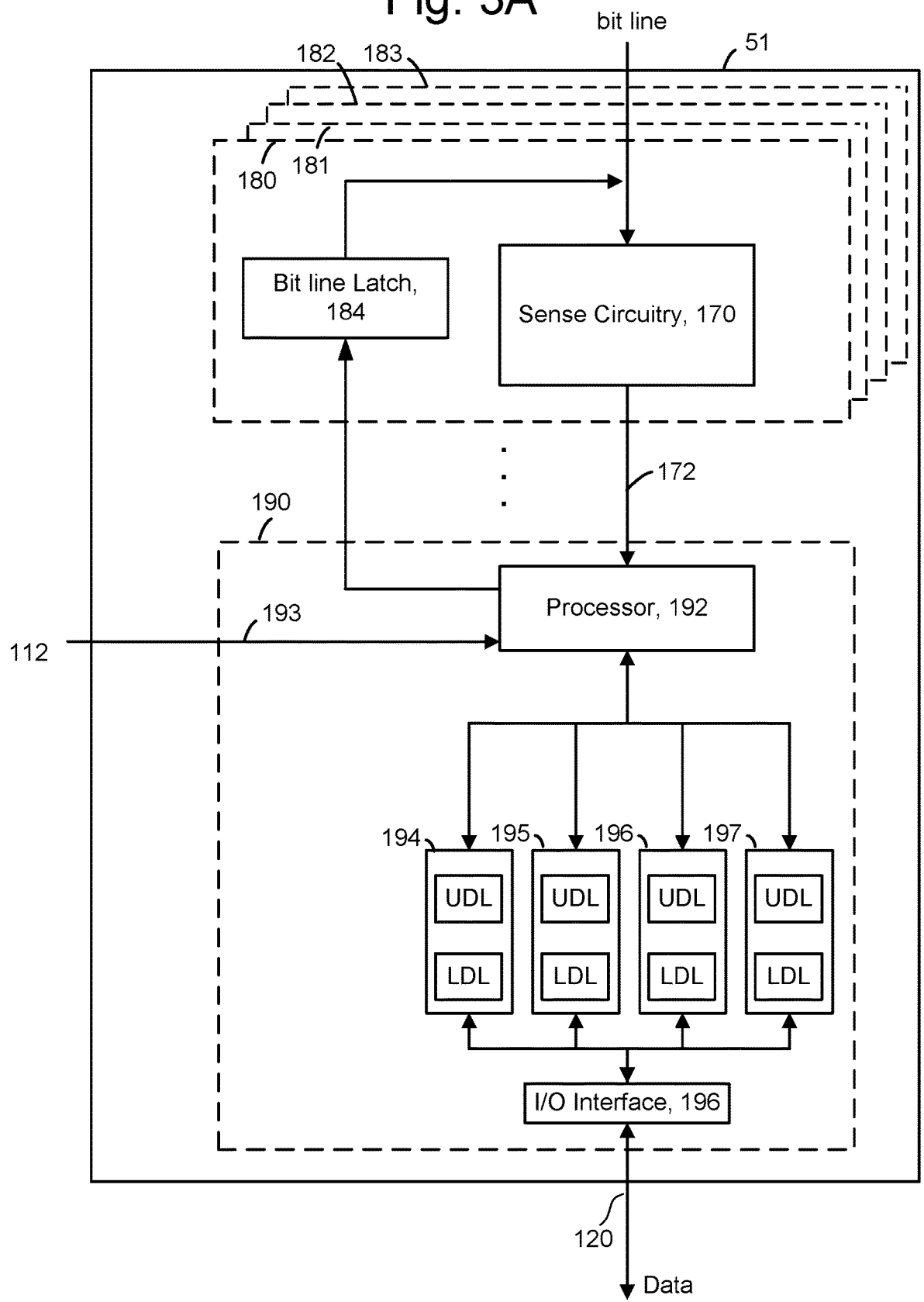
FIG. 3A is a block diagram depicting one embodiment of the sense block 51 of FIG. 1.

FIG. 3A is a block diagram depicting one embodiment of the sense block 51 of FIG. 1 or sense block 350 of FIG. 2. An individual sense block 51 is partitioned into one or more core portions, referred to as sense circuits 180-183 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements.

The sense circuit 180, as an example, comprises sense circuitry 170 that performs sensing by determining whether a conduction current in a connected bit line is above or below a predetermined threshold level. Sense circuit 180 also includes a bit line latch 184 that is used to set a voltage condition on the connected bit line. For example, a predetermined state latched in the bit line latch will result in the connected bit line being pulled to a state designating program inhibit (e.g., 1.5-3 V). As an example, a flag=0 can inhibit programming, while flag=1 does not inhibit programming.

The managing circuit 190 comprises a processor 192, four example sets of data latches 194-197 and an I/O Interface 196 coupled between the set of data latches 194 and data bus 120. One set of data latches, e.g., LDL and UDL, can be provided for each sense circuit. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

The processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading and verifying, the operation of the system is under the control of state machine 112 that controls the supply of different control gate voltages to the addressed storage element. As it steps through the various predefined control gate voltages corresponding to the various memory states supported by the memory, the sense circuit 180 may trip at one of these voltages and a corresponding output will be provided from sense circuit 180 to processor 192 via bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197. In another embodiment of the managing circuit 190, bit line latch serves double duty, both as a latch for latching the output of the sense circuit 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL and UDL latches, in a two-bit per storage element implementation. In a three-bit per storage element implementation, an additional data latch may be used. The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch so as to cause the bit line to be pulled to a state designating program inhibit. This inhibits the storage element coupled to the bit line from further programming even if program pulses appear on its control gate. In other embodiments the processor initially loads the bit line latch and the sense circuitry sets it to an inhibit value during the verify process.

Each set of data latches 194-197 may be implemented as a stack of data latches for each sense circuit. In one embodiment, there are three data latches per sense circuit 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated storage element has reached certain mileposts in a program operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

FIG. 3B depicts another example block diagram of the sense block 51 of FIG. 1 or sense block 350 of FIG. 2. The column control circuitry can include multiple sense blocks, where each sense block performs sensing, e.g., read, program verify or erase verify operations for multiple memory cells via respective bit lines. In one approach, a sense block comprises multiple sense circuits, also referred to as sense amplifiers. Each sense circuit is associated with data latches and caches. For example, the example sense circuits 350a, 351a, 352a and 353a are associated with caches 350c, 351c, 352c and 353c, respectively.

In one approach, different subsets of bit lines can be sensed using different respective sense blocks. This allows the processing load which is associated with the sense circuits to be divided up and handled by a respective processor in each sense block. For example, a sense circuit controller 360 can communicate with the set, e.g., sixteen, of sense circuits and latches. The sense circuit controller may include a pre-charge circuit 361 which provides a voltage to each sense circuit for setting a pre-charge voltage. The sense circuit controller may also include a memory 362 and a processor 363.

Figure 4:
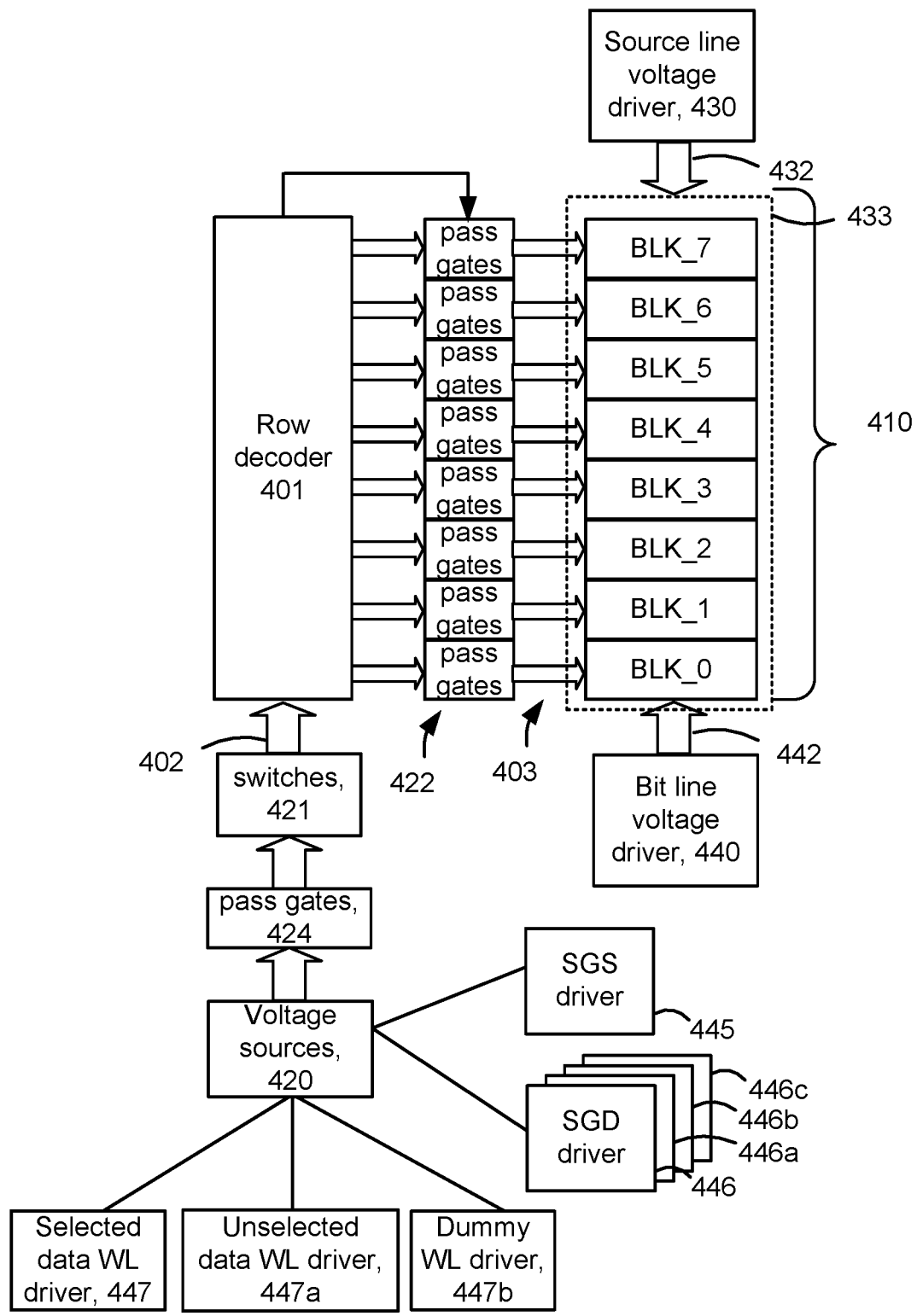
FIG. 4 depicts an example circuit for providing voltages to blocks of memory cells.

FIG. 4 depicts an example circuit for providing voltages to blocks of memory cells. In this example, a row decoder 401 provides voltages to word lines and select gates of each block in set of blocks 410. The blocks could be in a plane and includes blocks BLK_0 to BLK_7. The row decoder provides a control signal to pass transistors 422 which connect the blocks to the row decoder. Typically, program or read operations are performed on one selected block at a time and on one selected sub-block of the block. An erase operation may be performed on a selected block or sub-block. The row decoder and pass gates can connect global control lines 402 to local control lines 403. The control lines represent conductive paths. Voltages are provided on the global control lines from voltage sources 420 to pass transistors 422. The voltage sources may provide voltages to switches 421 which connect to the global control lines. Pass transistors 424 are controlled to pass voltages from the voltage sources 420 to the switches 421.

The voltage sources 420 can provide voltages on word lines (WL), SGS control gates and SGD control gates, for example. The voltage sources can include a selected word line (WL) driver 447, which provides a voltage on a word line selected during a program or read operation, a driver 447a for unselected data word lines, and a dummy word line driver 447b which provides voltages on dummy word lines.

The voltage sources can also include a common SGS driver 445 and separate SGD drivers for each sub-block. For example, SGD drivers 446, 446a, 446b and 446c can be provided for SB0, SB1, SB2 and SB3, respectively. In another option, a separate SGS driver is provided for each sub-block.

The various components, including the row decoder, may receive commands from a controller such as the state machine 112 or the controller 122 to perform the functions described herein.

A source line voltage source 430 provides the voltage Vs1 to the source lines/diffusion region in the substrate via control lines 432. In one approach, the source diffusion region 433 is common to the blocks. A set of bit lines 442 is also shared by the blocks. A bit line voltage source 440 provides voltages to the bit lines.

Figure 5:
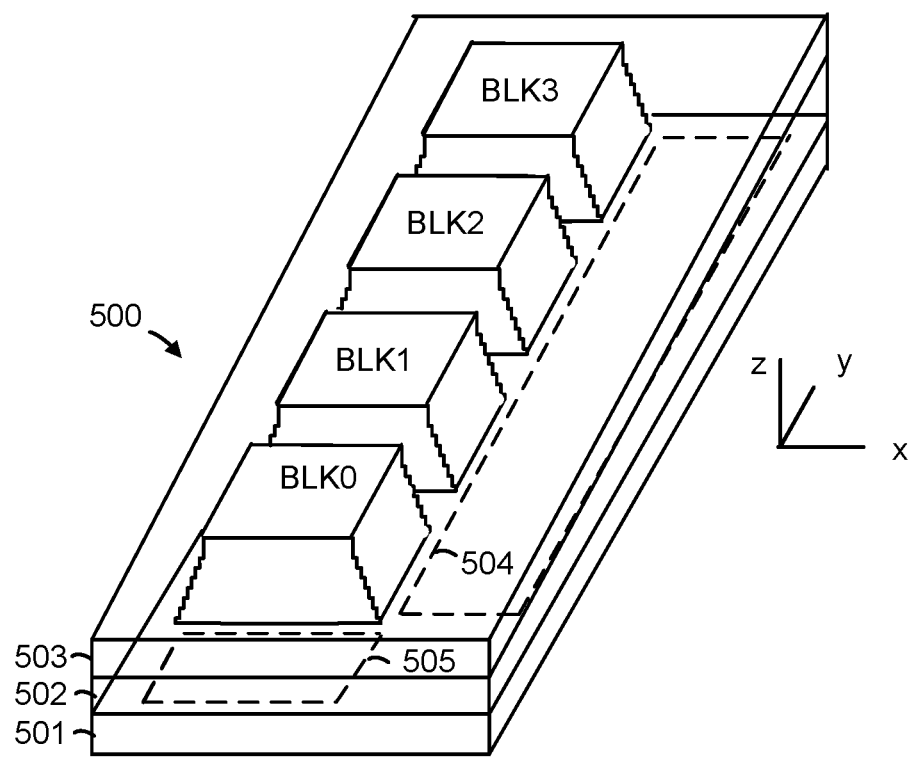
FIG. 5 is a perspective view of a memory device 500 comprising a set of blocks in an example 3D configuration of the memory structure 126 of FIG. 1.

FIG. 5 is a perspective view of a memory device 500 comprising a set of blocks in an example 3D configuration of the memory structure 126 of FIG. 1 or memory structure 326 of FIG. 2. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The pass transistors for a voltage driver of the SGS transistors may be located in this peripheral area 505, in one approach. In this case, the blocks BLK0, BLK1, BLK2 and BLK3 are at progressively further distances from the pass transistors. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 6A depicts an example cross-sectional view of a portion of one of the blocks of FIG. 5. The block comprises a stack 610 of alternating conductive and dielectric layers. In this example, the conductive layers comprise two SGD layers, one SGS layer, two source-side dummy word line layers (or word lines) WLS1 and WLS0, two drain-side dummy word line layers WLD1 and WLD0, and eleven data word line layers (or data word lines) WL0-WL10. WL0 is a source-side data word line and WLS1 is a dummy word line layer which is adjacent to the source-side data word line. WLS0 is another dummy word line layer which is adjacent to WLS1. WL10 is a drain-side data word line and WLD1 is a dummy word line layer which is adjacent to the drain-side data word line. WLD0 is another dummy word line layer which is adjacent to WLD1. The dielectric layers are labelled as DL1-DL19. Further, regions of the stack which comprise NAND strings NS1 and NS2 are depicted. Each NAND string encompasses a memory hole 618 or 619 which is filled with materials which form memory cells adjacent to the word lines. Region 622 of the stack is shown in greater detail in FIG. 6C.

The stack includes a substrate 611. In one approach, a portion of the source line SL comprises an n-type source diffusion layer 611a in the substrate which is in contact with a source end of each string of memory cells in a block. An erase voltage may be applied to this layer in an erase operation The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts an example variation in the width of the memory holes of FIG. 6A along their height. Due to the etching process used to create the memory holes, and the very high aspect ratio, the cross-sectional width, e.g., diameter, of a memory hole can vary along its height. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

FIG. 6C depicts a close-up view of the region 622 of the stack of FIG. 6A. Memory cells are formed at the different levels of the stack at the intersection of a word line layer and a memory hole. In this example, SGD transistors 718 and 717 are provided above dummy memory cells 716 and 715 and a data memory cell 714. A number of layers can be deposited along the sidewall (SW) of the memory hole 630 and/or within each word line layer, e.g., using atomic layer deposition. For example, each pillar 699 or column which is formed by the materials within a memory hole can include a blocking oxide layer 663, a charge-trapping layer 664 or film such as silicon nitride (Si3N4) or other nitride, a tunneling layer 665, a channel 660 (e.g., comprising polysilicon), and a dielectric core 666. A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string comprises a channel which extends continuously from one or more source-end select gate transistors to one or more drain-end select gate transistors.

When a memory cell is programmed, electrons are stored in a portion of the charge-trapping layer which is associated with the memory cell (i.e. in charge-trapping elements formed in the charge-trapping layer). These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7 depicts a voltage signal used in a series of program loops in an example program operation. The horizontal axis denotes a program loop (PL) number, ranging from 1-22, and the vertical axis denotes voltage. During a program operation, program loops are performed for a selected word line in a selected block in each plane. A program loop comprises a program portion in which a program voltage or pulse is applied to the selected word line followed by a verify portion in which a verify signal is applied to the selected word line while one or more verify tests are performed for the associated memory cells. Other than the erased state, each assigned state has a verify voltage which is used in the verify test for the state in a program operation.

The voltage signal 700 includes a series of program voltages, including an initial program voltage 701, which are applied to a word line selected for programming. In this example, the voltage signal includes program voltages which increase stepwise in amplitude in one or more program loops of a programming pass using a fixed or varying step size. This is referred to as incremental step pulse programming, where the program voltage starts at an initial level Vpgm_int (see initial program voltage 701) and increases in a step in each successive program loop, for instance, until the program operation is completed. A successful completion occurs when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 702, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification.

All memory cells may initially be in the erased state at the beginning of the program operation, for instance. After the program operation is completed, the data can be read from the memory cells using read voltages which are between the Vth distributions. At the same time, a read pass voltage, Vpass (e.g., 8-10 V), also referred to as pass voltage, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE (see FIG. 8). The data of the middle page can be determined by reading the memory cells using read voltages of VrB, VrD and VrF. The data of the upper page can be determined by reading the memory cells using read voltages of VrC and VrG. Memories that store more than one bit per cell may be referred to as Multi-Level Cell (MLC) memory, which includes Three Level Cell (TLC) memory (storing three bits per cell using eight data states) and Quad Level Cell (QLC) memory (storing four bits per cell using sixteen data states). Memories that store one bit per cell using two data states may be referred to as Single Level Cell (SLC) memory.

Figure 8:
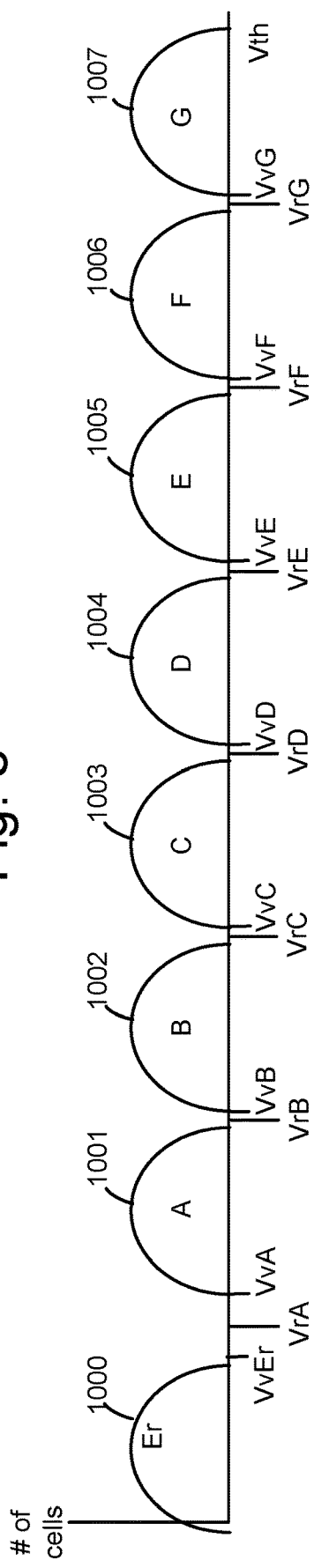
FIG. 8 depicts an example of memory cell threshold voltages of a plurality of memory cells programmed to different data states to store data.

FIG. 8 depicts an example Vth distribution of sets of memory cells after a program operation in a set of memory cells with eight data states, or three bits per cell. The vertical axis depicts a number of memory cells, on a logarithmic scale, and the horizontal axis depicts a Vth of the memory cells on a linear scale. In one approach, at a start of the program operation, the memory cells are all initially in the erased state 1000. After the program operation is successfully completed, the memory cells assigned to the Er state may be upshifted due to some amount of program disturb which normally occurs.

The memory cells which are to be programmed to the A, B, C, D, E, F and G states using verify voltages of VvA, VvB, VvC, VvD, VvE, VvF and VvG, respectively, are represented by the Vth distributions 1001, 1002, 1003, 1004, 1005, 1006 and 1007, respectively. Read voltages VrA, VrB, VrC, VrD, VrE, VrF and VrG can be used for reading the states of the memory cells in a read operation. These verify voltages and read voltages are examples of control gate read levels of the selected word line voltage.

After data is stored for some time in memory cells, the data may become obsolete, may be copied to another location, or for some other reason it may be desirable to erase the memory cells. In many non-volatile memory designs, erase is performed on a block-by-block basis. A subset of memory cells within a block may not be separately erased in such a design (block-erasable memory) so that a block may be considered the minimum unit of erase.

Figure 9:
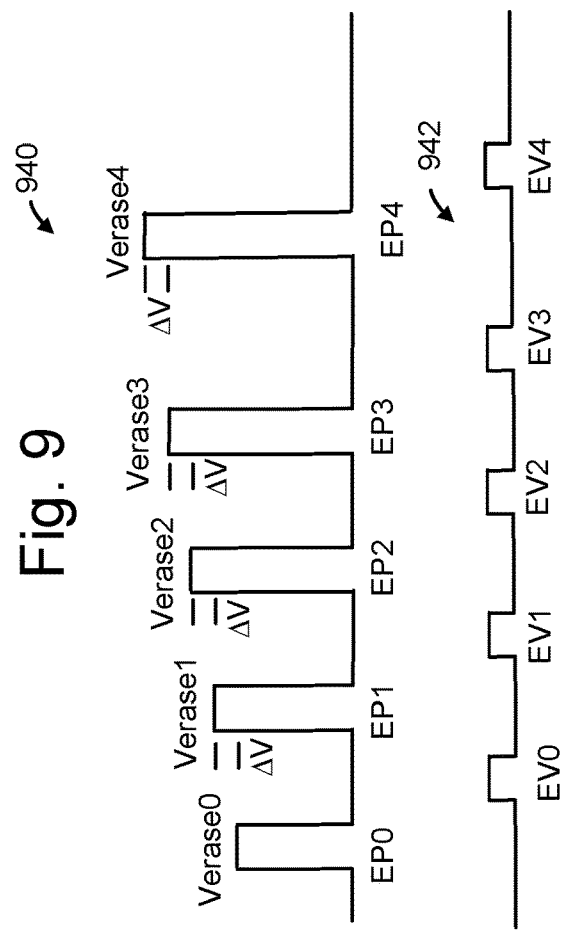
FIG. 9 depicts an example of erase pulses in an erase operation.

FIG. 9 shows a series of erase pulses 940 that are used during one embodiment. The erase pulse voltage is stepped up gradually by an increment ΔV from Verase0 to Verase4. In this example, four erase pulses (EP0-EP3) are applied to the memory cells, with voltage stepped up from Verase0 to Verase4. Erase verify is performed between erase pulses as illustrated by a series of erase verify steps 942. For example, after erase pulse EP0, erase verify step EV0 compares threshold voltages of memory cells to see if they are in the erased state 1000. After erase pulse EP1, erase verify step EV1 compares threshold voltages to check again. After erase pulse EP2, erase verify step EV2 compares threshold voltages to check again, and so on until erase verify step EV4. Erase verify step EV4 determines that all (or substantially all) memory cells are in erased state 1000 (threshold voltages below the erase verify voltage VvEr) and thus the erase operation is complete. If erase verify EV4 does not show all or substantially all memory cells in erased state 1000, one or more additional erase pulses and erase verify steps may be performed.

Erase verify compares threshold voltages of memory cells with a reference voltage (e.g. VvEr) to check if threshold voltages of memory cells are at erased levels (i.e. at a level corresponding to erased state 1000 with threshold voltages below VvEr). If not all of the NAND strings have passed erase verify at any erase verify step, then another erase pulse is applied. The memory cells can then be verified again. Thus, an erase operation continues to apply erase pulses until all or substantially all memory cells are in the erased state 1000.

In some non-volatile memories, data may be stored in a non-sequential manner so that a block may contain data that is not sequential (e.g. unrelated data from different files in the same block). This leads to blocks containing a mix of valid and obsolete data as some data in a block is replaced with new data that is stored in another block and other data in the block remains valid. Garbage collection may be required to consolidate valid data from such blocks. Such memories may program and erase blocks many times as blocks are garbage collected and reused.

Some non-volatile memories may have low endurance so that they become unreliable after a relatively small number of write erase cycles (e.g. 2000 cycles). For example, non-volatile memories that use charge trapping in non-conductive charge storage elements rather than conductive charge storage elements (e.g. floating gates) may have relatively low endurance. Data may be written sequentially in such memories so that fragmentation does not occur, and garbage collection is unnecessary, thus reducing the number of write erase cycles experienced by blocks. Data may be randomly read in such blocks and such memory may be referred to as "sequential write, random read memory." Data in blocks of such memory may remain in place, in the same block, for an extended period of time. Such non-volatile memory may be suitable for storage of data that is not frequently updated (e.g. posting online content that is not updated after posting, such as a video recording).

When the same data is stored in the same non-volatile memory cells over an extended period of time, the data may degrade. For example, charge may be lost from charge storage elements (e.g. charge trapping elements) over time as electrons migrate thereby causing "data retention" problems. Degradation may also occur due to disturbance caused by reading non-volatile memory cells. Such "read disturb" problems may affect cells that are read and neighboring cells and may cause threshold voltages to shift. In general, degradation of stored data causes memory cells to be read as being in different data states than the data states to which they were programmed as their threshold voltages shift (either up or down) from their programmed level. Small shifts in threshold voltage may be more significant in memories that store a larger number of bits per cell (i.e. where the threshold voltage window for each data state is narrow, a change in data state may be caused by a small shift in threshold voltage). Thus, data retention and read disturb may be of particular concern in MLC memories that store three, four, or more bits per cell (more than in SLC memories, or MLC memories that store two bits per cell).

While ECC or other techniques can correct a number of errors, when the number of errors in data read exceeds correction capability, the data may be unrecoverable. It is generally desirable to avoid data degrading to the point of being unrecoverable. Furthermore, ECC and other such techniques may take significant time and resources when degradation of stored data causes a high Bit Error Rate (BER). Therefore, it may be desirable to avoid degradation even at levels that are correctable by ECC or other technique.

One technique for limiting the effects of degradation of stored data (e.g. due to data retention and read disturb effects) is to recycle blocks so that data is moved before it becomes degraded beyond a certain level.

Figure 10:
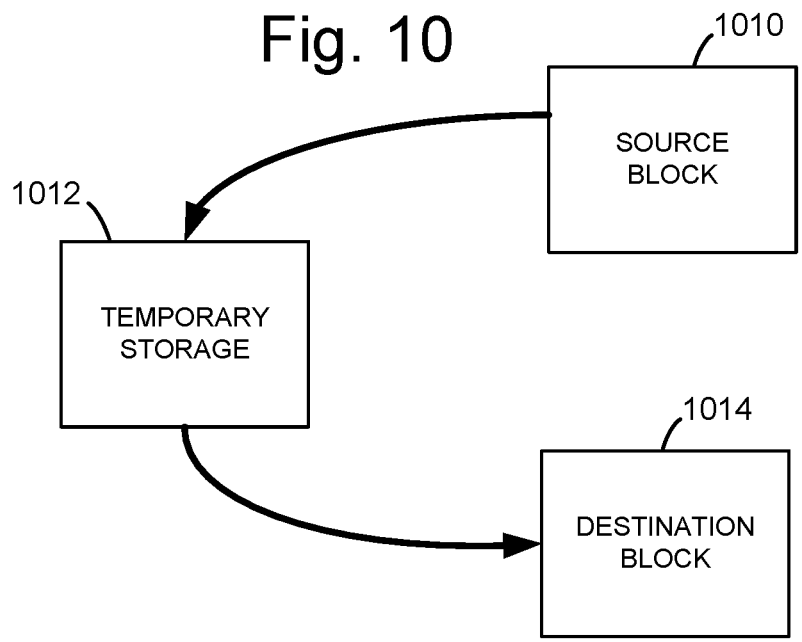
FIG. 10 depicts an example of a copying degraded data from a block to another block.

FIG. 10 shows an example of block recycling that may be used to move data periodically to mitigate effects of data retention and read disturb. A source block 1010 (e.g. MLC block with four or more data states) is identified as a candidate for block recycling. Data is read from source block 1010 and is copied to temporary storage 1012. The read data is then written to a destination block 1014 (e.g. MLC block). Destination block 1014 may be a block that was previously erased (e.g. kept in an erased block pool for subsequent use) so that all or substantially all non-volatile memory cells of destination block 1014 are in the erased state 1000 prior to this recycle operation. Subsequent to successful copying of data from source block 1010, source block 1010 may be erased so that it may be used again. For example, non-volatile memory cells in source block 1010 store data prior to recycling and may be in various data states 1000-1007. Their threshold voltages are then reduced to the erased state 1000 using a series of erase pulses as illustrated in FIG. 9. After erase (i.e. when erase verify indicates that all or substantially all non-volatile memory cells are in erased state 1000), source block 1010 may be made available for storage of data again (e.g. returned to an erased block pool).

It can be seen that recycling in this manner includes erasing a block and programming a block (e.g. source block 1010 is erased and destination block 1014 is programmed during the recycling operation of FIG. 10). Erasing as illustrated in FIG. 9 exposes non-volatile memory cells to a number of erase pulses, which may subject components of memory cells (e.g. charge trapping elements) to high voltages for significant times, which may cause damage to non-volatile memory cells. Programming as illustrated in FIG. 7 exposes non-volatile memory cells to a number of programming pulses, which may also subject components of memory cells to high voltages for significant times, which may cause damage to non-volatile memory cells. Thus, recycling as illustrated in FIG. 10 may be a significant factor in causing a non-volatile memory to wear out (reach its endurance limit).

Figure 11A:
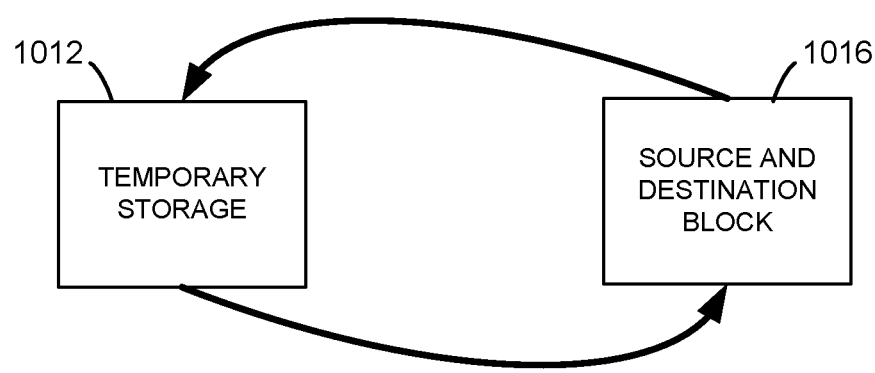

FIG. 11A shows an example of a technique that can avoid degradation of stored data beyond a certain level without exposing non-volatile memory cells to the damage caused by program and erase operations described above. Instead of separate source block 1010 and destination block 1014 of FIG. 10, FIG. 11 shows source and destination block 1016, which is both the source of data copied to temporary storage 1012 and the destination for the same data, which is written back to the same cells in the same block (i.e. to source and destination block 1016). This is done without erasing source and destination block 1016 as illustrated in FIG. 9 and without programming source and destination block 1016 as illustrated in FIG. 7 so that non-volatile memory cells of source and destination block 1016 are not exposed to damage in the same way. Furthermore, the operation of FIG. 11 may be performed more rapidly than the operation of FIG. 10.

Rather than erase source and destination block 1016, the threshold voltages of memory cells are reduced to intermediate levels above erased levels in what may be referred to as a "soft erase" and are subsequently increased back to their programmed levels in what may be referred to as a "soft program." Thus, non-volatile memory cells go from initial threshold voltage levels corresponding to programmed data to intermediate levels below the initial levels and above an erased level in a soft erase. Threshold voltages of the non-volatile memory cells are then increased from the intermediate levels to final levels corresponding to the programmed data. Final levels may be similar to initial levels, with some adjustment to correct errors (e.g. data may be subject to ECC prior to being written back). By reducing threshold voltages only to intermediate levels, not to an erased level, damage to non-volatile memory cells is reduced and the time required is also reduced.

Figure 11B:
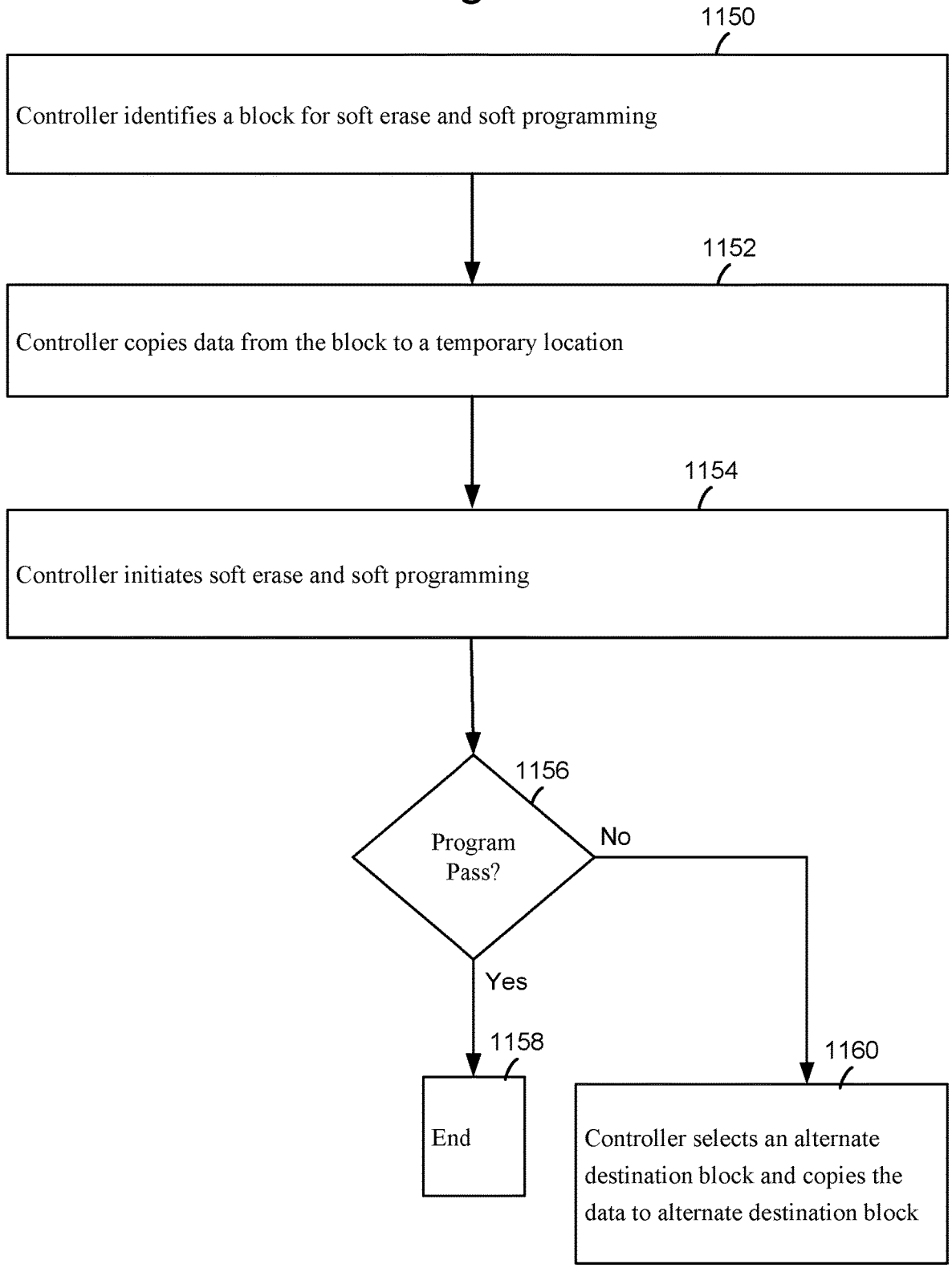

FIG. 11B illustrates an example of how the technique of FIG. 11A may be implemented in a non-volatile storage apparatus such as memory device 101 of FIG. 1A. A controller identifies a block for soft erase and soft programming 1150 (e.g. controller 102 may identify a block in memory packages 104). The controller copies data from the block to a temporary location 1152 (e.g. temporary storage 1012). The controller initiates soft erase and soft programming 1154, which may reduce threshold voltages of non-volatile memory cells of the block from initial levels corresponding to programmed data to intermediate levels below the initial levels and above erased levels and increase threshold voltages from the intermediate levels to their programmed levels without erasing them (i.e. without reducing their threshold voltages to erased levels). Soft programming may include one or more program verify steps and when a block passes 1156 the soft erase and soft programming operation ends 1158. If a block does not pass after a maximum number of attempts, the controller may initiate a copy to an alternate destination (e.g. as illustrated in FIG. 10). The controller selects an alternate destination block (e.g. destination block 1014) and copies the data to the alternate destination block 1160.

FIG. 12A illustrates a population of non-volatile memory cells in a QLC block with sixteen data states (Erased state 1000, and states S1-S15) representing four bits per cell. FIG. 12A corresponds to the TLC example of FIG. 8, with read and verify voltages omitted for clarity. The population of non-volatile memory cells shown in FIG. 12A is programmed with approximately the same number of non-volatile memory cells in each distribution shown (i.e. about the same number in each data state) corresponding to random data. Some overlap is shown between distributions associated with neighboring data states. Some overlap (cells programmed to a data state that are read as being in an adjacent data state) may be corrected by ECC. As data degrades, overlapping of these distributions increases thereby increasing the BER.

FIG. 12B illustrates the population of non-volatile memory cells of FIG. 12A in the erased state 1000, i.e. with all or substantially all non-volatile memory cells having threshold voltages at erase levels (some unerased cells may be acceptable where ECC can correct any resulting bad bits after programming). The erased state 1000 is not shown in its entirety, only the upper edge of the distribution is shown for simplicity and it will be understood that the drawings are not necessarily to scale (the erased state 1000 includes all non-volatile memory cells that were shown in data states S1-S15 and thus has a higher number of cells than any individual distribution of FIG. 12A). Thus, FIG. 12B illustrates non-volatile memory cells in a block that has been erased and has not yet been programmed (such as a block in an erased block pool). For example, the non-volatile memory cells of FIG. 12B may be in a block that has been subject to the erase operation illustrated in FIG. 9.

FIG. 12C illustrates the population of non-volatile memory cells of FIGS. 12A-B in an intermediate state that is neither the programmed state of FIG. 12A nor the erased state of FIG. 12B. Distribution 1220 shows how threshold voltages of non-volatile memory cells are generally at intermediate levels that are, on average, lower than their programmed levels of FIG. 12A and higher than their erased levels of FIG. 12B. The intermediate threshold voltage levels indicated by distribution 1220 is the result of a soft erase, which includes applying one or more soft erase pulses to the population of non-volatile memory cells. This reduces threshold voltages of non-volatile memory cells by some amount, though the amount of such reduction is generally less than in the case of an erase operation. While some non-volatile memory cells in lower data states (e.g. data states S1, S2) may have their threshold voltages reduced to erased state 1000 by a soft erase, many non-volatile memory cells remain with their threshold voltages somewhere between their initial level (e.g. initial level in data states S1-S15 shown in FIG. 12A) and an erased level (e.g. a level corresponding to erased state 1000). Thus, non-volatile memory cells in the highest data state, S15, have had their threshold voltages reduced so that there are few or no non-volatile memory cells with threshold voltages corresponding to data state 15. Distributions of non-volatile memory cells associated with data states S1-S15 are indistinct in the illustration of FIG. 12A as non-volatile memory cells may have their threshold voltages reduced by different amounts depending on individual cell characteristics (i.e. all cells of a distribution S1-S15 do not necessarily move together). While threshold voltages of all non-volatile memory cells in data states S1-S15 may be reduced to intermediate levels by a soft erase, the intermediate levels reached may not correspond to any programmed data so that an attempt to read the non-volatile memory cells of FIG. 12C would not be expected to return the programmed data.

From the intermediate threshold voltage levels illustrated by distribution 1220, non-volatile memory cells may be returned to their initial threshold voltage levels S1-S15 in a soft programming operation. Threshold voltage levels illustrated by distribution 1220 might not allow programming of random data because some non-volatile memory cells with higher threshold voltages might require programming to data states corresponding to lower threshold voltages if random data was programmed. However, the non-volatile memory cells may be reprogrammed with the same data that they previously stored since threshold voltages have only been reduced (not increased) by soft erase and thus all such non-volatile memory cells may have their threshold voltages increased back to their initial levels. Furthermore, such programming involves a relatively small change in threshold voltage, which can be implemented by soft programming, which may be quicker and less damaging than programming from the erased state.

Figure 13A:
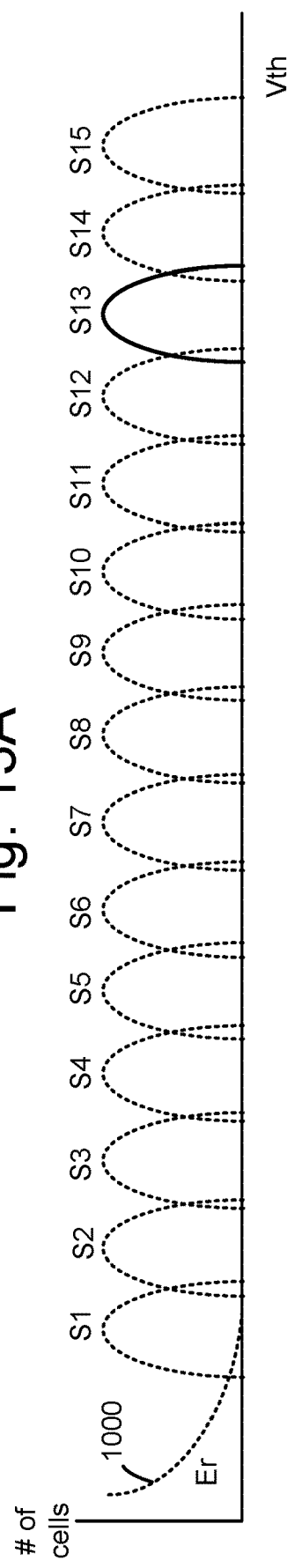
FIGS. 13A-B illustrate an example of threshold voltages of non-volatile memory cells at programmed levels and at intermediate levels respectively.
Figure 13B:
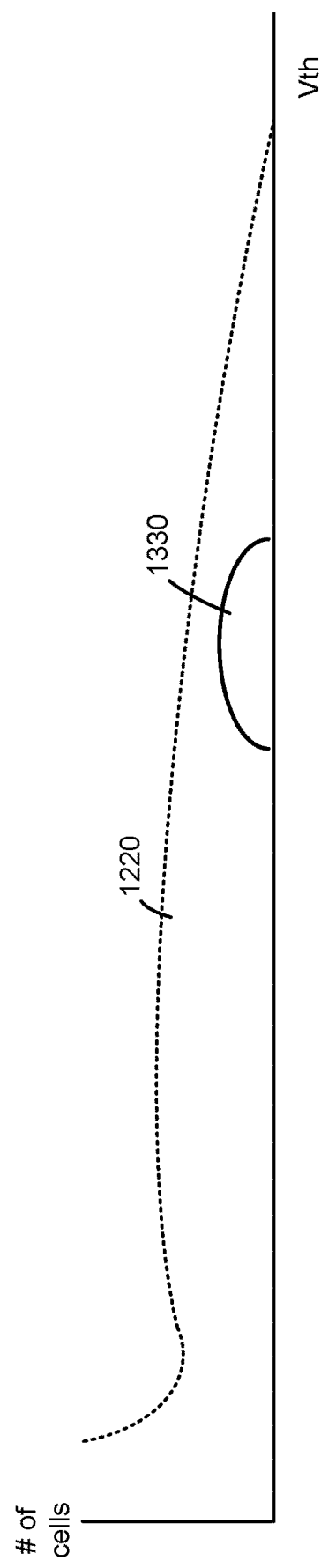

To further illustrate, FIGS. 13A-B show an example of a particular distribution of memory cells that are programmed to data state S13 (FIG. 13A). Subsequent to a soft erase, the overall population of non-volatile memory cells have threshold voltage distribution 1220 and the non-volatile memory cells previously in data state S13 have distribution 1330. Non-volatile memory cells in data state S13 have their threshold voltages reduced by a soft erase to threshold voltage levels (illustrated by distribution 1330) that are closer to their programmed levels (corresponding to data state S13) than if they had been reduced to erased state 1000. This allows them to be rapidly programmed back to their initial levels (data state S13) without subjecting the non-volatile memory cells to potentially damaging conditions that may occur during erase and program operations. In short, it may be better for endurance of non-volatile memory cells in data state S13 to be soft erased to threshold voltage levels of distribution 1330 and then soft programmed back to data state S13 than to be erased all the way to erased state 1000 and subsequently programmed with the same or different data, e.g. to one of data states S1-S15. The effects of such soft erase followed by soft programming may be less damaging to memory cell components than an erase to erased state 1000 followed by programming from erased state 1000 back to the programmed state. While distribution 1330 is illustrated in FIG. 13B, it will be understood that while the distributions of different data states S1-S15 are distinguishable in FIG. 13A, corresponding distributions after soft erase (e.g. distribution 1330) are merged with a high degree of overlapping so that they are not distinguishable. Thus, a read operation performed on distribution 1220 does not return programmed data. Non-volatile memory cells in other data states S1-S15 are similarly affected by soft erase (threshold voltage shifted down to intermediate voltages between their data states and the erased state).

Figure 14A:
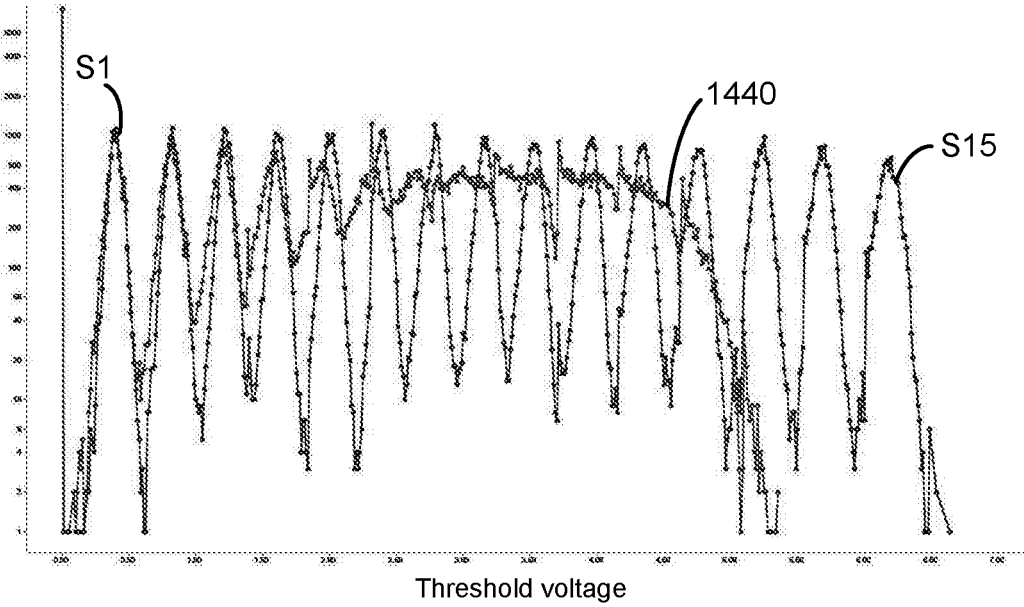
FIGS. 14A-B illustrate an example of threshold voltages of non-volatile memory cells in initial states, intermediate states, and final states.
Figure 14B:
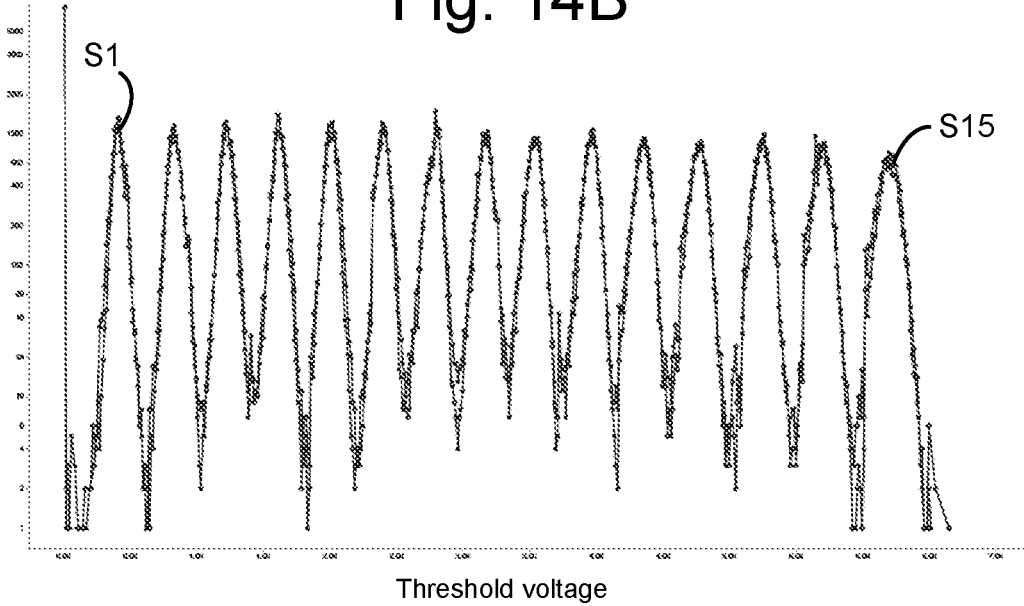

FIGS. 14A-B illustrate another example of distributions threshold voltage of a population of non-volatile memory cells (QLC cells in this example) implementing soft erase and soft programming. Plots of FIGS. 14A-B show threshold voltage on the x-axis and the number of cells on the y-axis. FIG. 14A shows distributions of non-volatile memory cells in initial states corresponding to data states S1-S15 along with distribution 1440, which corresponds to the same non-volatile memory cells after soft erase with threshold voltages at intermediate levels. Thus, FIG. 14A shows both the threshold voltages of non-volatile memory cells in their initial states (corresponding to data stored in non-volatile memory cells prior to soft erase) and their threshold voltages after soft erase (distribution 1440). It can be seen that distribution 1440 includes few memory cells with threshold voltages corresponding to higher data states and causes distributions to merge.

FIG. 14B shows distributions of non-volatile memory cells corresponding to data states S1-S15 in both initial states (corresponding to data stored in non-volatile memory cells prior to soft erase) and after soft erase and soft programming (e.g. after soft programming from intermediate threshold voltage levels illustrated by distribution 1440). It can be seen that the plots are generally indistinguishable so that non-volatile memory cells have generally been returned to their initial states. This is achieved without an erase (i.e. without having their threshold voltages reduced to an erased level). It will be understood that threshold voltages of some individual non-volatile memory cells may be different after soft erase and soft programming (e.g. as a result of ECC correction) but that overall distributions of non-volatile memory cells in data states appear generally the same.

Figure 15:
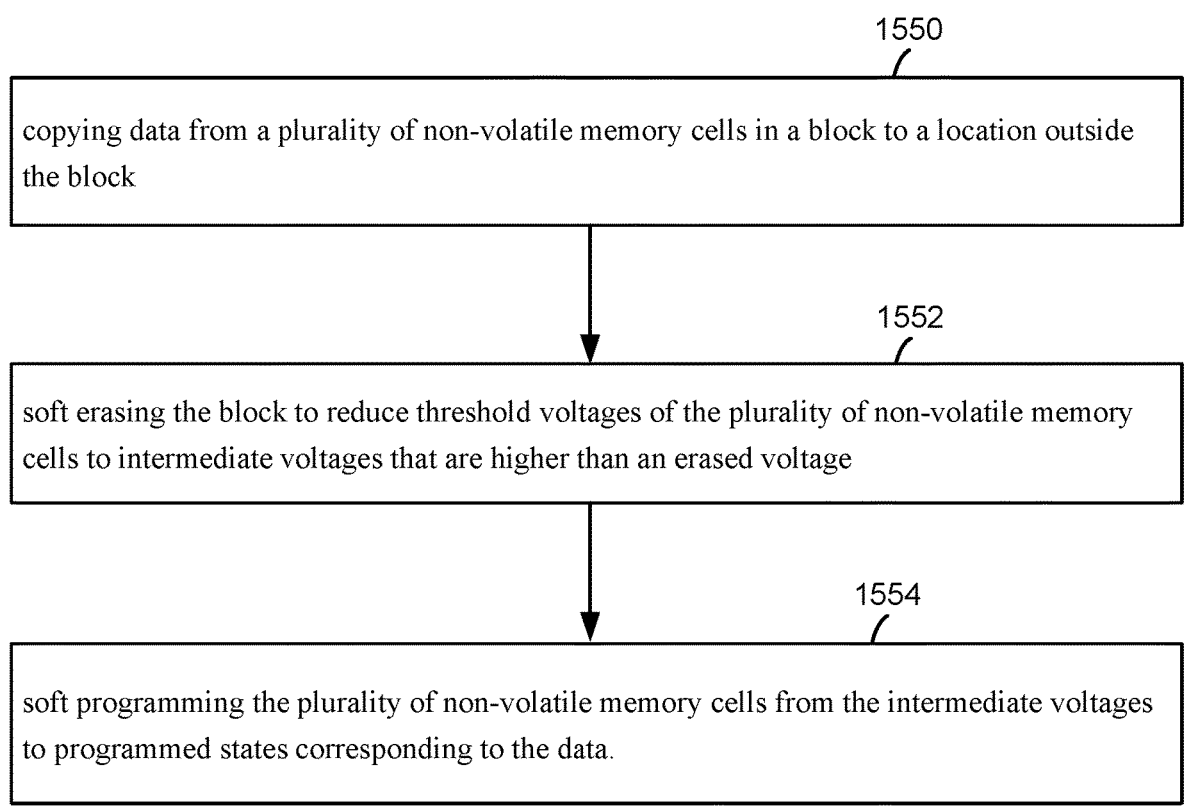
FIG. 15 illustrates an example of a method that includes soft erasing and soft programming.

FIG. 15 illustrates a method that includes copying data from a plurality of non-volatile memory cells in a block to a location outside the block 1550, which may be a temporary location. For example, the plurality of non-volatile memory cells may be in an MLC block in a non-volatile memory die and the temporary location may be in a Single Level Cell (SLC) block in the non-volatile memory die. In another example, the plurality of non-volatile memory cells are in a Multi-Level Cell (MLC) block in a non-volatile memory and the temporary location is in a volatile memory. Data may be corrected by ECC circuits (e.g. ECC engine 245 prior to storage at the temporary location). The method includes soft erasing the block to reduce threshold voltages of the plurality of non-volatile memory cells to intermediate voltages that are higher than an erased voltage 1552. For example, applying one or more soft erase pulses that are at least one of: fewer in number, less in voltage, or shorter in duration than erase pulses used to erase the block to reduce threshold voltages of the plurality of non-volatile memory cells to below the erased voltage (e.g. less than Verase0 of FIG. 9, of shorter duration than EP0, and applying fewer than four pulses). This may result in less damage to non-volatile memory cells than an erase operation. Soft erase may be performed without erase verify since the intermediate threshold voltages do not require any verification. Soft erase may include a single erase pulse without erase verify so that it can be completed rapidly. The method further includes soft programming the plurality of non-volatile memory cells from the intermediate voltages to programmed states corresponding to the data 1554. This may be achieved by applying one or more soft programming pulses that are at least one of: fewer in number, less in voltage, and shorter in duration than programming pulses used to program the plurality of non-volatile memory cells from below an erased state to programmed states (e.g. less than Vpgm_int of FIG. 7, shorter in duration than initial program voltage 701 and fewer than 22 pulses). Program verify may be performed between soft programming pulses to verify states of the plurality of non-volatile memory cells at the programmed states.

Soft erase and soft programming may be performed as a background operation when a memory system is not busy executing host commands. Thus, the process illustrated in FIG. 15 may occur in a memory system that has power and is not currently executing or expecting a host command. The process may be interrupted if a host command is received so that performance is not impacted.

Figure 16:
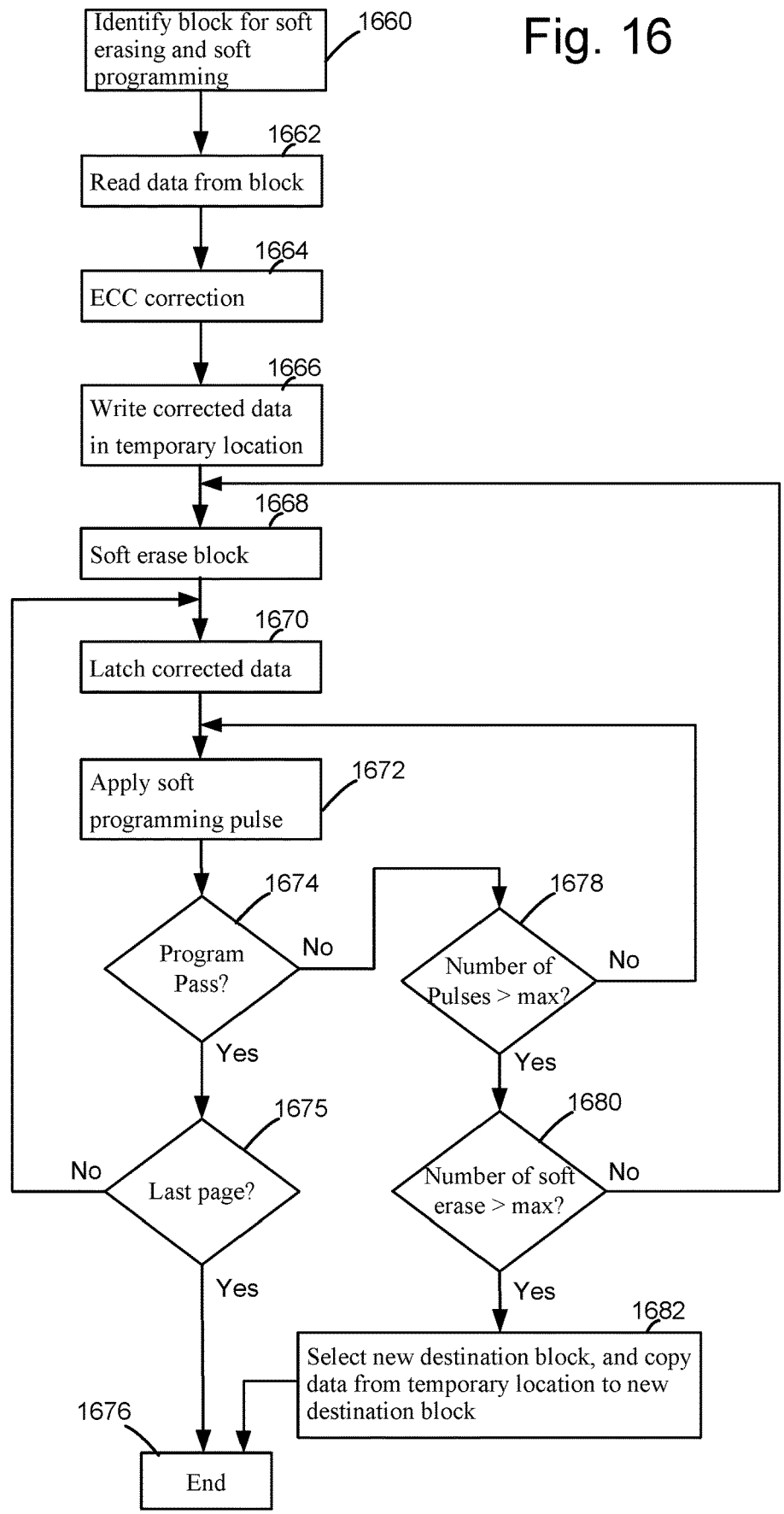
FIG. 16 illustrates an example of a method that includes soft erasing and soft programming.

FIG. 16 shows a more detailed example of a method that includes identifying a block for soft erasing and soft programming 1660. For example, identifying the block for soft erasing and soft programming may include a controller such as controller 102 of memory device 101 using one or more of: time since programming, bit error rate, and number of read operations to identify a block in a memory package 104. Data retention errors may increase as a function of time since programming (in combination with temperature and/or other factors in some cases). Read disturb errors may increase according to the number of read operations directed to a block. BER may reflect errors caused by both data retention and read disturb effects. In some cases, a combination of such factors is used by a controller to identify a block for soft erasing and soft programming. The method includes reading data from the block 1662, performing ECC correction 1664 (e.g. ECC engines 226/256 of controller 102 correcting data), and writing the corrected data in a temporary location 1666. For example, corrected data may be written in an SLC block (which is generally quicker to write and has a lower BER than MLC) or may be written to volatile memory (e.g. local memory 106, SRAM 230/260, buffers 232/262), or some other location outside of the block. The block is then subject to soft erase 1668 (without erase verify) and corrected data from the temporary location is latched 1670 so that it can be written back to the block (e.g. corrected data corresponding to a page is copied from the temporary location to latches of read/write circuits 128). A soft programming pulse is applied 1672 to program the corrected data from the latches back to the non-volatile memory cells of the block (i.e. to write the same data to the same cells so that cells are returned to their initial states—with the exception of any cells containing ECC-corrected bits). A program verify operation is performed to determine if the non-volatile memory cells pass programming 1674, e.g. to determine if all or substantially all non-volatile memory cells are in data states corresponding to the corrected data in the latches. If the non-volatile memory cells pass 1674 then a determination is made as to whether the programmed page was the last page 1675, e.g. the last page to be programmed in the block. If it is the last page then the process ends 1676 with all the data that was copied from the block back in the block (generally, with some errors corrected and with less overlap between threshold voltage distributions of data states to give lower BER). If it is not the last page 1675, then the next page is latched 1670 and soft programming proceeds for the next page.

When a program verify does not indicate program pass 1674 then a determination is made as to whether the number of program pulses is greater than a maximum 1678. If the number of program pulses is not greater than the maximum, then another soft programming pulse (which may use an incremented programming voltage) is applied 1672 so that the process may include a series of program-verify loops until program pass 1674. If the number of pulses is greater than the maximum and the number of soft erases is not greater than a maximum 1680 then the block is subject to soft erase 1668 may be repeated. In some cases, soft erase may be repeated with a soft erase pulse of higher voltage and/or longer duration than a previous soft erase pulse. In this way, if a soft erase pulse fails to sufficiently reduce threshold voltages of non-volatile memory cells, a subsequent soft erase pulse of higher voltage and/or longer duration may sufficiently reduce threshold voltages. Soft programming is then repeated. If the number of soft erase operations is greater than the maximum 1680, then soft erase and soft programming may not be viable for the block and a different approach may be used (program verify fail after max number of soft erase and soft program operations may indicate another approach). In response to such a failure, a new destination block selected by the controller, and data may be copied from the temporary location to the new destination block 1682 (an alternate block). The destination block may be an erased block and programming may include programming memory cells from the erased state (not from intermediate states). This approach is similar to the approach illustrated in FIG. 10, which shows destination block 1014 that is different to source block 1010. Once the block is erased, it may be reused (e.g. returned to an erased block pool for subsequent programming) or may be discarded (because soft erase and soft programming failed).

While FIG. 16 shows soft erase and soft programming of a block, it will be understood that at some time the data in a block may become obsolete so that an erase (not soft erase) and subsequent programming (not soft programming) may occur. A block may be subject to soft erase and soft programming one or more times to maintain data and may subsequently be subject to erase and programming to store new data. During the lifetime of a block, it may be subject to multiple program-erase cycles, with multiple soft erase-soft program cycles within an individual program-erase cycle.

In some cases, the same erase circuits may be used for both erase and soft erase and the same programming circuits may be used for both programming and soft programming. Thus, aspects of the present technology may be implemented in some memory systems in an efficient manner that takes advantage of existing hardware.

Figure 17:
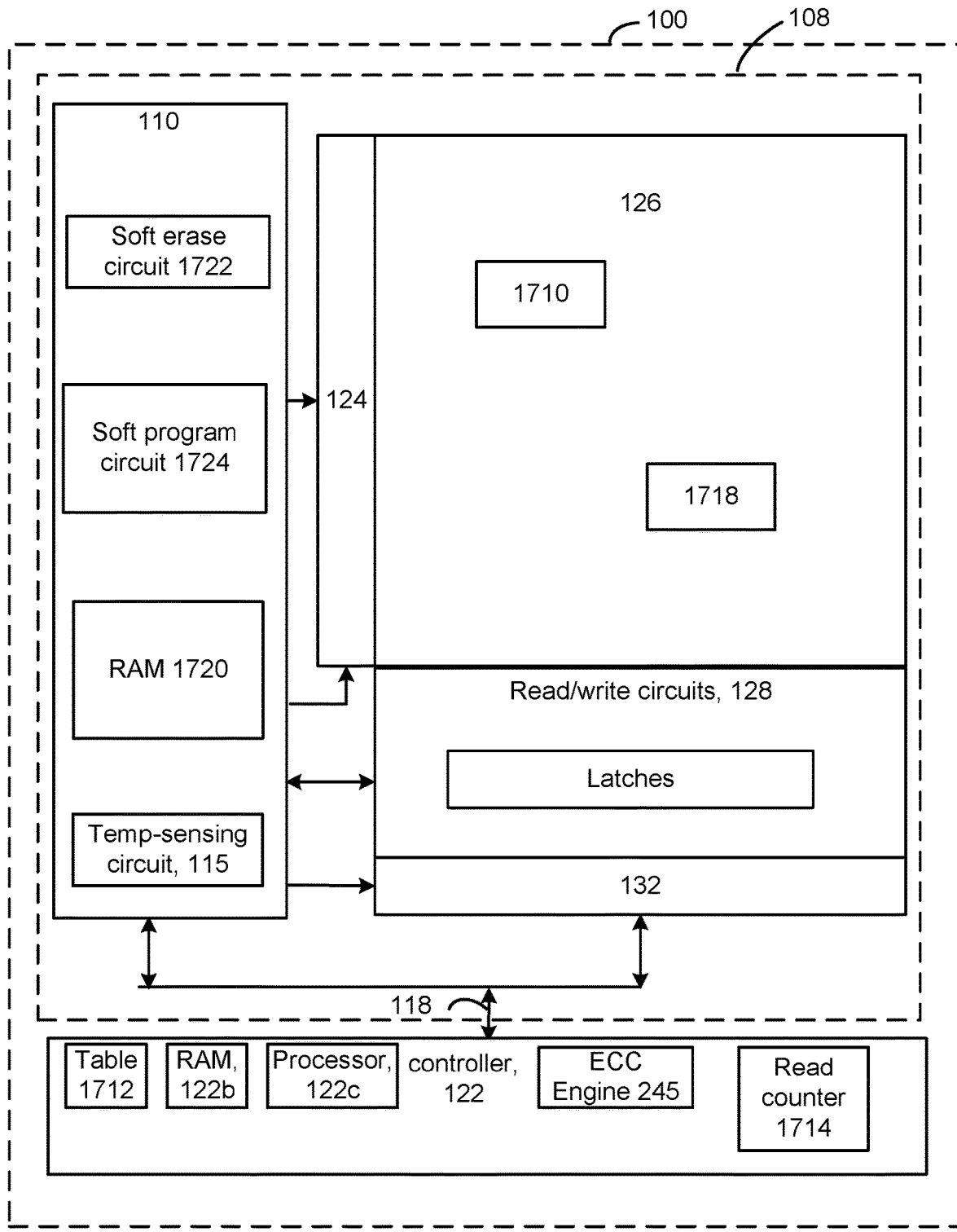
FIG. 17 shows an example of a storage device adapted to implement soft erase and soft programming.

FIG. 17 shows an example of memory device 100 adapted to implement aspects of the present technology including soft erasing and soft programming (certain components are omitted for clarity). Memory structure 126 includes a block 1710 that may be identified for a soft erase and soft programming operation (block 1710 includes a plurality of memory cells that contain programmed data). For example, block 1710 may be a MLC block (e.g. QLC block) that has stored the same data for more than a threshold amount of time (or time above a predetermined temperature), has been read more than a threshold number of times, and/or has a BER that is greater than a threshold number. For example, a table 1712 records the times at which different blocks in memory structure 126 were last programmed (or soft programmed) so that a candidate may be selected based on time since last program (or soft program). This may be combined with temperature from temperature-sensing circuit 115 to use a combination of time and temperature to trigger soft erasing and soft programming. ECC engine 245 may provide a BER for data read from block 1710, which may trigger soft erase and soft programming of block 1710. Read counter 1714 maintains a count of how many times a block such as block 1710 has been read, which can be used to trigger soft erasing and soft programming. Some combination of these factors may be used as a trigger for soft erase and soft programming. Processor 122c of controller 122 may be configured (by firmware or otherwise) to identify block 1710 as a candidate for soft erase and soft programming based on information from one or more of table 1712, ECC engine 245, and read counter 1714 and/or other information. Thus, table 1712, ECC engine 245, and read counter 1714 may be considered means for identifying a block containing a plurality of non-volatile memory cells for soft erasing and soft programming.

Data from block 1710 may be corrected by ECC engine 245 and then stored at a temporary location such as in block 1718, which may be an SLC block, in RAM 122b, or in RAM 1720, which is formed on memory die 108. ECC engine 245 may be considered a means for correcting data from the plurality of non-volatile memory cells. Block 1718, RAM 122b, and RAM 1720 may be considered means for temporarily storing data from the plurality of non-volatile memory cells. Soft erase circuit 1722 is provided in control circuitry 110 to provide soft erase pulses. Soft erase circuit 1722 may be combined with erase circuits (e.g. using common components such as charge pumps to generate soft erase voltage pulses and erase voltage pulses) and may be configured to erase and soft erase blocks at different times. Soft erase circuit 1722 may be considered means for soft erasing the plurality of non-volatile memory cells to reduce threshold voltages of the plurality of non-volatile memory cells from initial levels corresponding to programmed data to intermediate levels below the initial levels and above an erased level. Soft program circuit 1724 is provided in control circuitry 110 to provide soft programming pulses. Soft programming circuit 1724 may be combined with programming circuits (e.g. using common components such as word line driver circuits) and may be configured to program and soft program at different times. Soft program circuit 1724 may be considered a means for performing soft programming to increase threshold voltages of the plurality of non-volatile memory cells from the intermediate levels to final levels corresponding to the programmed data.

An example non-volatile storage apparatus includes a plurality of non-volatile memory cells and control circuitry configured to apply one or more soft erase pulses to the plurality of non-volatile memory cells to reduce threshold voltages of the plurality of non-volatile memory cells from initial levels corresponding to programmed data to intermediate levels below the initial levels and above an erased level and apply one or more soft programming pulse to increase threshold voltages of the plurality of non-volatile memory cells from the intermediate levels to final levels corresponding to the programmed data.

In an example, the control circuitry is further configured to read the plurality of non-volatile memory cells at the initial levels and copy read data to a temporary location. The plurality of non-volatile memory cells may be in a Multi-Level Cell (MLC) block in a non-volatile memory die and the temporary location may be in a Single Level Cell (SLC) block in the non-volatile memory die. The plurality of non-volatile memory cells may be in a Multi-Level Cell (MLC) block in a non-volatile memory and the temporary location may be in a volatile memory. The circuitry may be further configured to perform Error Correction Code (ECC) correction of the read data prior to copying the read data to the temporary location. The control circuitry may be further configured to verify the plurality of non-volatile memory cells at the final levels corresponding to the programmed data. The control circuitry may be further configured to erase the plurality of non-volatile memory cells by applying erase pulses to the plurality of non-volatile memory cells to reduce threshold voltages of the plurality of non-volatile memory cells to levels below the erase level, the erase pulses are higher in voltage and/or longer in duration than soft erase pulses. The control circuitry may be further configured to program the plurality of non-volatile memory cells from below the erased level by applying programming pulses to the plurality of non-volatile memory cells to increase threshold voltages of the plurality of non-volatile memory cells to programmed levels, the programming pulses may be higher in voltage and/or longer in duration than soft programming pulses. The plurality of non-volatile memory cells may include charge-trapping elements.

An example of a method includes copying data from a plurality of non-volatile memory cells in a block to a location outside the block; soft erasing the block to reduce threshold voltages of the plurality of non-volatile memory cells to intermediate voltages that are higher than an erased voltage; and soft programming the plurality of non-volatile memory cells from the intermediate voltages to programmed states corresponding to the data.

The method may include identifying the block for soft erasing and soft programming using one or more of: time since programming, bit error rate, and number of read operations. Soft programming may be performed subsequent to soft erasing without verifying the plurality of non-volatile memory cells at the intermediate voltages. The method may include correcting the data from the plurality of non-volatile memory cells prior to copying the data to the location outside the block. Soft erasing may include applying one or more soft erase pulses that are at least one of: fewer in number, less in voltage, or shorter in duration than erase pulses used to erase the block to reduce threshold voltages of the plurality of non-volatile memory cells to below the erased voltage. No erase verify may be performed between the soft erase pulses or between the soft erase pulses and a first soft programming pulse. Soft programming may include applying one or more soft programming pulses that are at least one of: fewer in number, less in voltage, and shorter in duration than programming pulses used to program the plurality of non-volatile memory cells from below an erased state to programmed states. The method may include performing program verify between soft programming pulses to verify states of the plurality of non-volatile memory cells at the programmed states. The method may include, in response to a failure to verify the plurality of non-volatile memory cells at the programmed states, selecting an alternate block, copying the data from the location outside the block to the alternate block, and erasing the block or discarding the block.

An example of a non-volatile storage apparatus includes a plurality of memory dies each including a non-volatile memory structure and a controller connected to the memory dies, the controller is configured to cause soft erase and soft programming of a plurality of non-volatile memory cells in the plurality of dies to reduce threshold voltages of the plurality of non-volatile memory cells from initial levels corresponding to programmed data to intermediate levels below the initial levels and above an erased level and apply one or more soft programming pulse to increase threshold voltages of the non-volatile memory cells from the intermediate levels to final levels corresponding to the programmed data.

The controller may be further configured to identify the plurality of non-volatile memory cells for soft erase and soft programming using one or more of: time since programming of the plurality of non-volatile memory cells, an error rate of data read from the plurality of memory cells, and a number of read operations directed to the plurality of non-volatile memory cells.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A non-volatile storage apparatus, comprising:
a plurality of non-volatile memory cells in a Multi-Level Cell (MLC) block in a non-volatile memory die; and
control circuits configured to read the plurality of non-volatile memory cells at initial levels corresponding to programmed data, copy read data to a temporary location in a Single Level Cell (SLC) block in the non-volatile memory die, apply one or more soft erase pulses to the plurality of non-volatile memory cells to reduce threshold voltages of the plurality of non-volatile memory cells from the initial levels corresponding to programmed data to intermediate levels below the initial levels and above an erased level and apply one or more soft programming pulse to increase threshold voltages of the plurality of non-volatile memory cells from the intermediate levels to final levels corresponding to the programmed data.

2. The non-volatile storage apparatus of claim 1 wherein the control circuits are further configured to record times at which blocks were last programmed and identify a block containing the plurality of non-volatile memory cells for soft erasing and soft programming using recorded time since last programming.

3. The non-volatile storage apparatus of claim 2 wherein the control circuits are further configured to identify the block for soft erasing and soft programming using a combination of the recorded time since last programming and temperature from a temperature-sensing circuit on the memory die.

4. The non-volatile storage apparatus of claim 1 wherein the control circuits are further configured to maintain a count of how many times blocks are read and identify a block containing the plurality of non-volatile memory cells for soft erasing and soft programming according to the number of times the block was read.

5. The non-volatile storage apparatus of claim 2 wherein the control circuits are further configured to perform Error Correction Code (ECC) correction of the read data prior to copying the read data to the temporary location.

6. The non-volatile storage apparatus of claim 1 wherein the control circuits are further configured to verify the plurality of non-volatile memory cells at the final levels corresponding to the programmed data.

7. The non-volatile storage apparatus of claim 1 wherein the control circuits are further configured to erase the plurality of non-volatile memory cells by applying erase pulses to the plurality of non-volatile memory cells to reduce threshold voltages of the plurality of non-volatile memory cells to levels below the erase level, the erase pulses are higher in voltage and/or longer in duration than soft erase pulses.

8. The non-volatile storage apparatus of claim 1 wherein the control circuits are further configured to program the plurality of non-volatile memory cells from below the erased level by applying programming pulses to the plurality of non-volatile memory cells to increase threshold voltages of the plurality of non-volatile memory cells to programmed levels, the programming pulses are higher in voltage and/or longer in duration than soft programming pulses.

9. The non-volatile storage apparatus of claim 1 wherein the plurality of non-volatile memory cells include charge-trapping elements.

10. A method comprising:
identifying a block for soft erasing and soft programming using a combination of time since programming of the block and temperature of a memory die where the block is located;
copying data from a plurality of non-volatile memory cells in the block to a location outside the block;
soft erasing the block to reduce threshold voltages of the plurality of non-volatile memory cells to intermediate voltages that are higher than an erased voltage; and
soft programming the plurality of non-volatile memory cells from the intermediate voltages to programmed states corresponding to the data.

11. The method of claim 10 further comprising:
maintaining a count of a number of read operations performed on the block;
identifying the block for soft erasing and soft programming using the number of read operations in combination with the time since programming of the block and temperature of the memory die where the block is located.

12. The method of claim 10 wherein soft programming is performed subsequent to soft erasing without verifying the plurality of non-volatile memory cells at the intermediate voltages.

13. The method of claim 10 wherein the block is a Multi Level Cell (MLC) block and the location outside the block is a Single Level Cell (SLC) block in the memory die.

14. The method of claim 10 wherein soft erasing includes applying one or more soft erase pulses that are at least one of: fewer in number, less in voltage, or shorter in duration than erase pulses used to erase the block to reduce threshold voltages of the plurality of non-volatile memory cells to below the erased voltage.

15. The method of claim 14 wherein no erase verify is performed between the soft erase pulses or between the soft erase pulses and a first soft programming pulse.

16. The method of claim 15 wherein soft programming includes applying one or more soft programming pulses that are at least one of: fewer in number, less in voltage, and shorter in duration than programming pulses used to program the plurality of non-volatile memory cells from below an erased state to programmed states.

17. The method of claim 16 further comprising performing program verify between soft programming pulses to verify states of the plurality of non-volatile memory cells at the programmed states.

18. The method of claim 17 further comprising, in response to a failure to verify the plurality of non-volatile memory cells at the programmed states, selecting an alternate block, copying the data from the location outside the block to the alternate block, and erasing the block or discarding the block.

19. A non-volatile storage apparatus, comprising:
a controller configured to be connected to a plurality of memory dies, each memory die including a non-volatile memory structure, the controller is configured to identify a plurality of non-volatile memory cells in a memory die for soft erase and soft programming using a combination of time since last programming of the plurality of non-volatile memory cells and temperature of the memory die, cause soft erase and soft programming of the plurality of non-volatile memory cells to reduce threshold voltages of the plurality of non-volatile memory cells from initial levels corresponding to programmed data to intermediate levels below the initial levels and above an erased level and apply one or more soft programming pulse to increase threshold voltages of the non-volatile memory cells from the intermediate levels to final levels corresponding to the programmed data.

20. The non-volatile storage apparatus of claim 19 wherein the controller is further configured to read the plurality of non-volatile memory cells at initial levels corresponding to programmed data and copy read data to a temporary location in a Single Level Cell (SLC) block in the memory die.

* * * * *